United States Patent
Woodruff et al.

(10) Patent No.: US 7,524,406 B2
(45) Date of Patent: Apr. 28, 2009

(54) PROCESSING APPARATUS INCLUDING A REACTOR FOR ELECTROCHEMICALLY ETCHING MICROELECTRONIC WORKPIECE

(75) Inventors: Daniel Woodruff, Kalispell, MT (US); Steve Eudy, Kalispell, MT (US); James Erickson, Columbia Falls, MT (US); Thomas Oberlitner, Kalispell, MT (US); Matthew Egloff, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 937 days.

(21) Appl. No.: 10/745,190

(22) Filed: Dec. 23, 2003

(65) Prior Publication Data

US 2004/0134774 A1 Jul. 15, 2004

Related U.S. Application Data

(60) Division of application No. 09/782,216, filed on Feb. 13, 2001, now Pat. No. 6,773,559, which is a continuation-in-part of application No. 09/476,526, filed on Jan. 3, 2000, now Pat. No. 6,547,937.

(51) Int. Cl.
*C25D 17/00* (2006.01)
*C25D 21/12* (2006.01)
(52) U.S. Cl. .................. 204/224 M; 204/224 R; 204/230.2
(58) Field of Classification Search .......... 204/224 M, 204/224 R, 230.2
See application file for complete search history.

(56) References Cited

U.S. PATENT DOCUMENTS 5,284,554 A 2/1994 Datta et al.
5,312,532 A 5/1994 Andricacos et al.

(Continued)

FOREIGN PATENT DOCUMENTS

EP 0343502 11/1989

(Continued)

OTHER PUBLICATIONS

U.S. Appl. No. 10/367,100, filed Feb. 14, 2003, Oberlitner et al.

*Primary Examiner*—Arun S Phasge
(74) *Attorney, Agent, or Firm*—Perkins Coie LLP; Kenneth H. Ohriner; Craig E. Bohn

(57) ABSTRACT

Although there are several inventions disclosed herein, the present application is directed to a reactor for electrochemically processing a microelectronic workpiece. The reactor comprises a movable electrode assembly that is disposed for movement along a motion path. The motion path includes at least a portion thereof over which the electrode assembly is positioned for processing at least one surface of the microelectronic workpiece. A cleaning electrode is located along the motion path of the movable electrode assembly. In one embodiment, a programmable controller is connected to direct the movable electrode assembly to move to the cleaning electrode during a cleaning cycle. At that time, the programmable controller connects the movable electrode assembly as an anode and the cleaning electrode as a cathode for cleaning of the movable electrode assembly. The cleaning electrode may be disposed along a position of the motion path that is beyond the range of motion required to process the microelectronic workpiece so that the programmable controller may be programmed to conduct a cleaning cycle while a microelectronic workpiece is present in the reactor for processing.

15 Claims, 16 Drawing Sheets

U.S. PATENT DOCUMENTS

| | | |
|---|---|---|
| 5,344,491 A | 9/1994 | Katou |
| 5,344,539 A | 9/1994 | Shinogi et al. |
| 5,421,987 A | 6/1995 | Tzanavaras et al. |
| 5,431,421 A | 7/1995 | Thompson et al. |
| 5,476,577 A | 12/1995 | May et al. |
| 5,486,282 A | 1/1996 | Datta et al. |
| 5,516,412 A | 5/1996 | Andricacos et al. |
| 5,531,874 A | 7/1996 | Brophy et al. |
| 5,536,388 A | 7/1996 | Dinan et al. |
| 5,543,032 A | 8/1996 | Datta et al. |
| 5,567,300 A | 10/1996 | Datta et al. |
| 5,614,076 A | 3/1997 | Brophy et al. |
| 5,865,984 A | 2/1999 | Corbin, Jr. et al. |
| 5,925,226 A | 7/1999 | Hurwitt et al. |
| 6,001,235 A | 12/1999 | Arken et al. |
| 6,024,856 A | 2/2000 | Haydu et al. |
| 6,037,790 A | 3/2000 | Dinan |
| 6,103,096 A | 8/2000 | Datta et al. |
| 6,132,586 A | 10/2000 | Adams et al. |
| 6,174,425 B1 | 1/2001 | Simpson et al. |
| 6,197,182 B1 | 3/2001 | Kaufman et al. |
| 6,228,231 B1 | 5/2001 | Uzoh |
| 6,251,250 B1 | 6/2001 | Keigler |
| 6,328,872 B1 | 12/2001 | Talieh et al. |
| 6,547,937 B1 | 4/2003 | Obertlitner et al. |
| 6,632,335 B2 * | 10/2003 | Kunisawa et al. ........ 204/230.2 |

FOREIGN PATENT DOCUMENTS

| | | |
|---|---|---|
| EP | 0726698 | 8/1996 |
| JP | 62297494 | 12/1987 |
| JP | 62297495 | 12/1987 |
| JP | 1120827 | 5/1989 |
| JP | 5175158 | 7/1993 |
| JP | 6260468 | 9/1994 |
| JP | 7211724 | 8/1995 |
| JP | 7284738 | 10/1995 |
| JP | 10172974 | 6/1998 |
| JP | 2000017480 | 1/2000 |
| JP | 11092993 | 1/2001 |
| WO | WO 99/25004 | 5/1999 |
| WO | WO 01/00173 | 1/2001 |
| WO | 2005042804 A2 | 5/2005 |

* cited by examiner

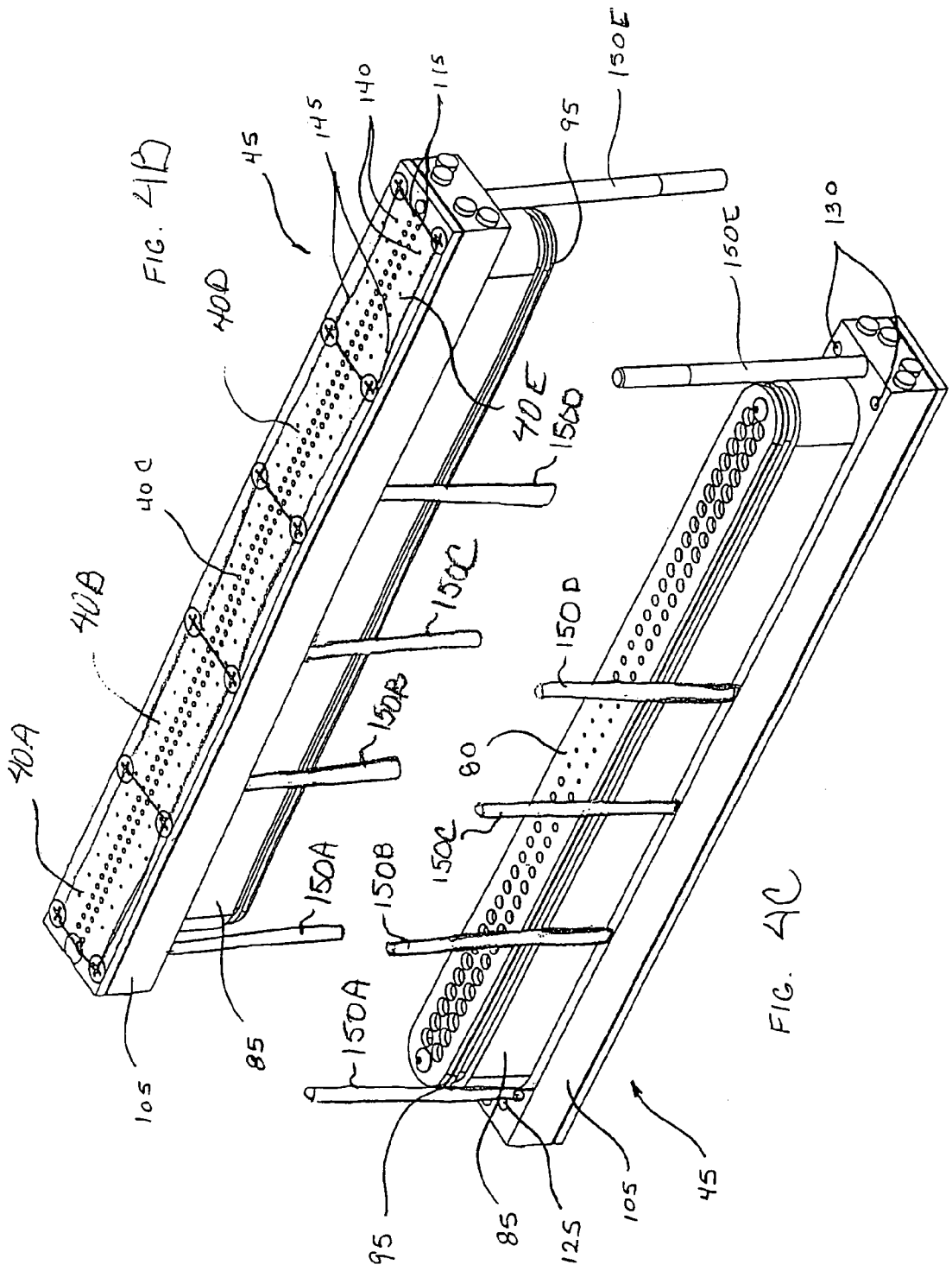

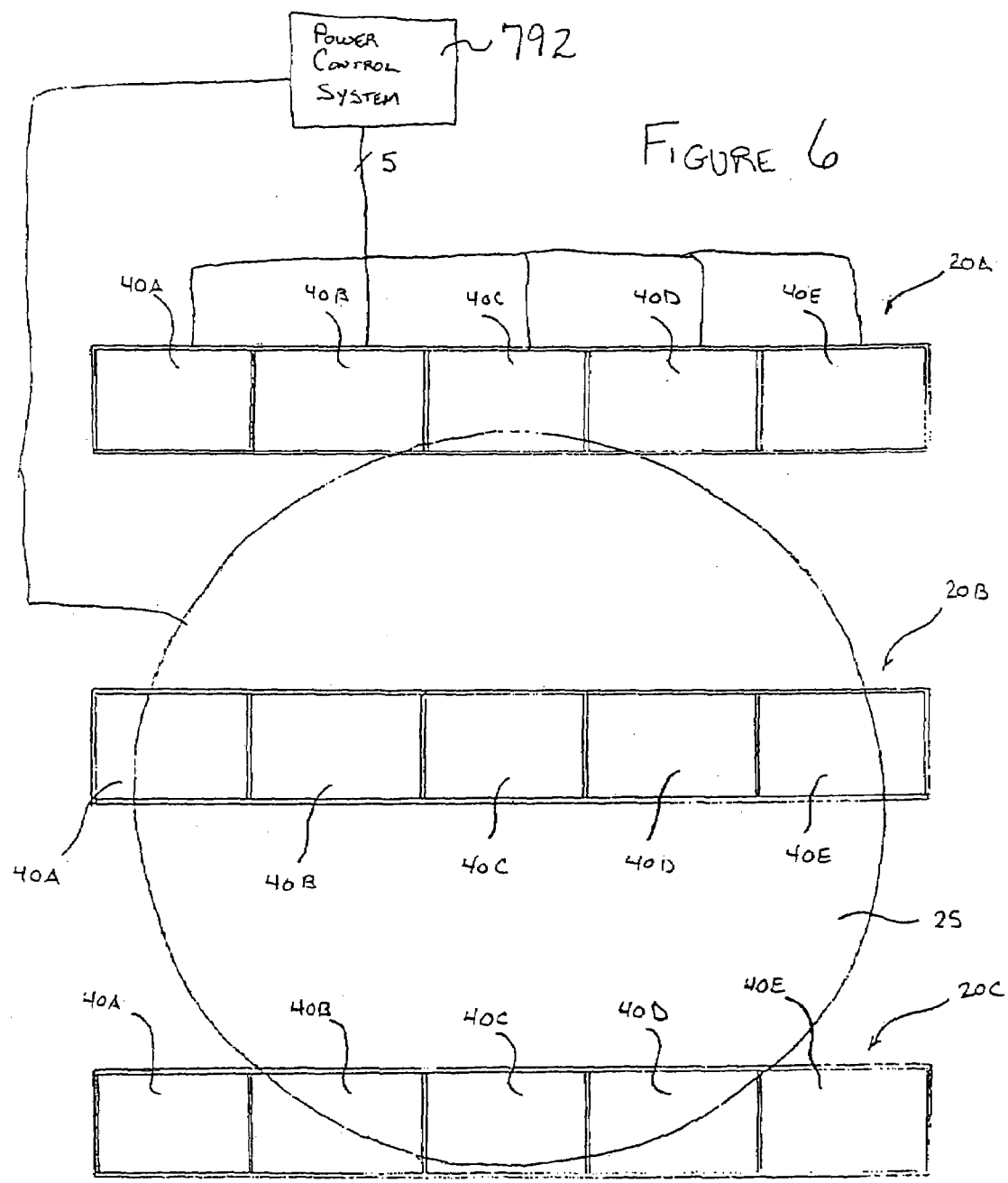

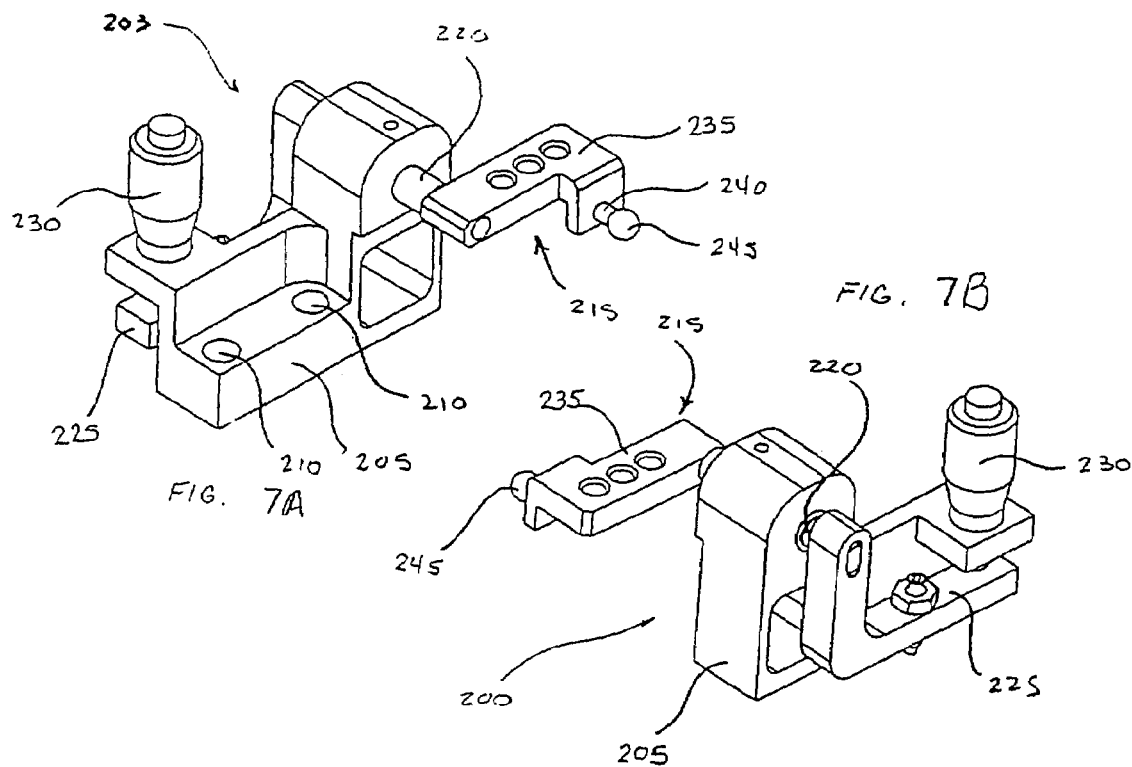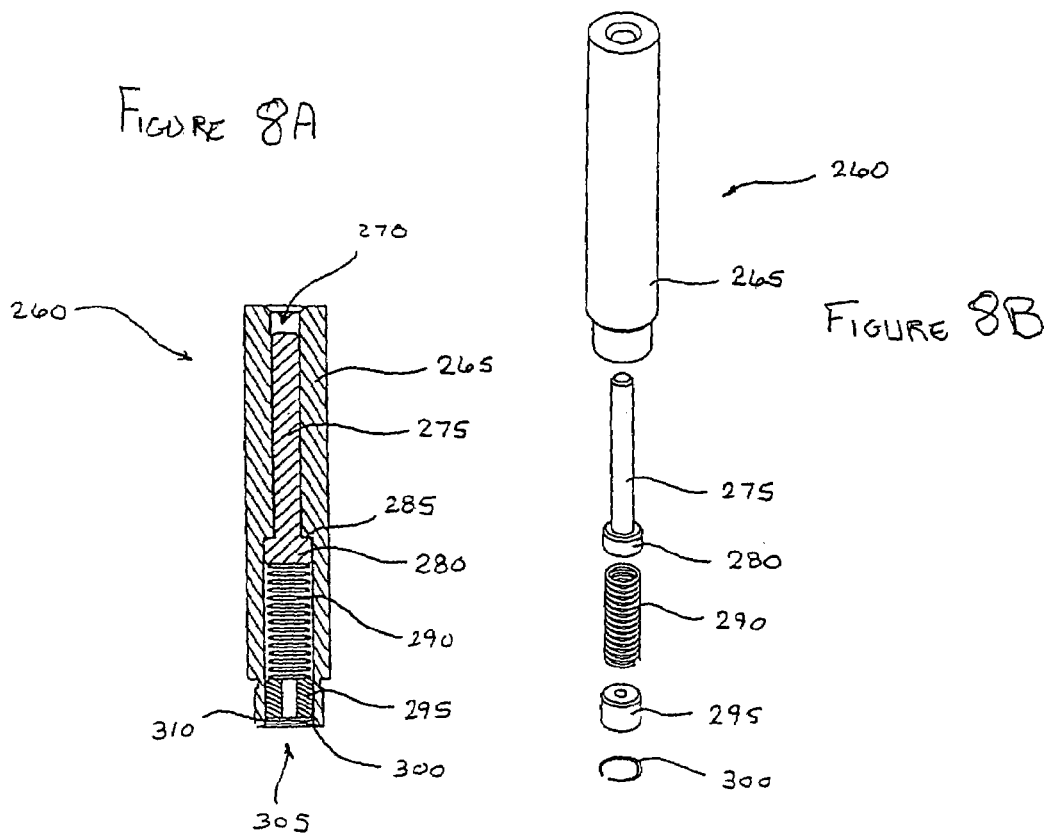

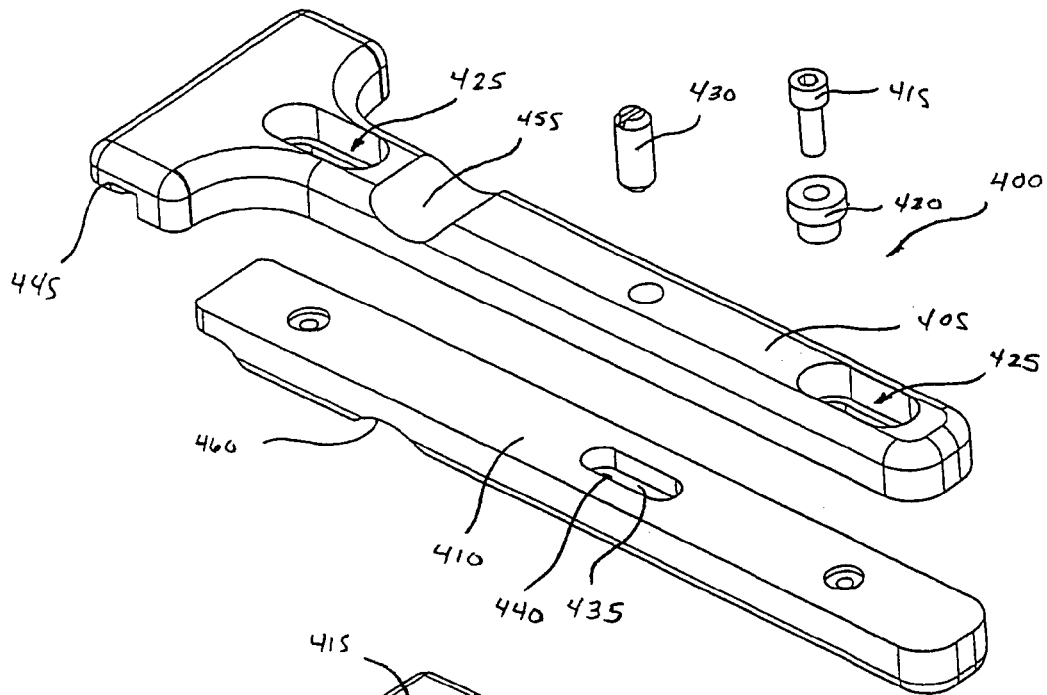
FIGURE 14A
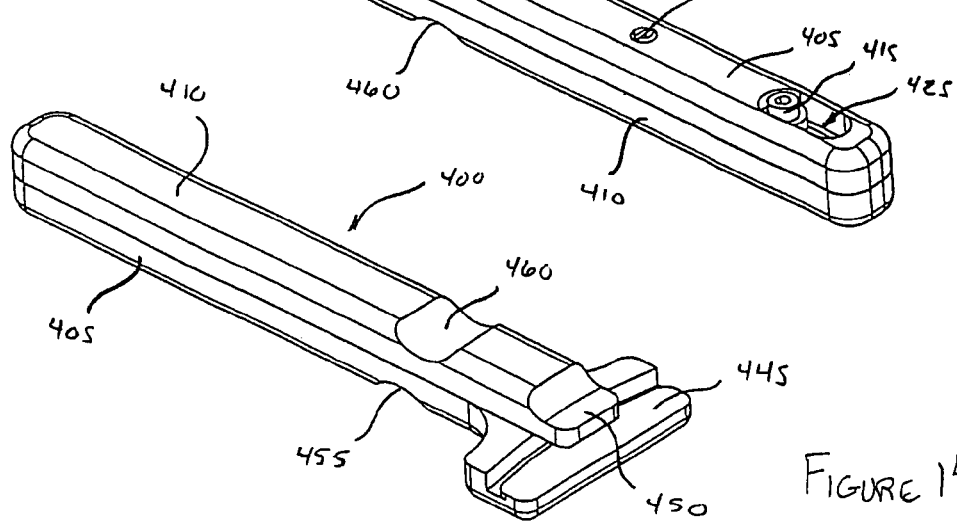
FIGURE 14B
FIGURE 14C

PROCESSING APPARATUS INCLUDING A REACTOR FOR ELECTROCHEMICALLY ETCHING MICROELECTRONIC WORKPIECE

CROSS-REFERENCE TO RELATED APPLICATIONS

This application is a divisional of U.S. application Ser. No. 09/782,216, filed Feb. 13, 2001 now U.S. Pat. No. 6,773,559, which is a a continuation-in-part of U.S. Ser. No. 09/476,526, entitled "A Microelectronic Workpiece Processing Tool Including a Processing Reactor Having a Paddle Assembly for Agitation of a Processing Fluid", filed Jan. 3, 2000 now U.S. Pat. No. 6,547,937.

STATEMENT REGARDING FEDERALLY SPONSORED RESEARCH R DEVELOPMENT

Not Applicable

BACKGROUND OF THE INVENTION

The present invention generally relates to an apparatus for processing a microelectronic workpiece. More particularly, the present invention is directed to a processing tool that includes an improved electrochemical processing reactor that may be used to electrochernically etch one or more layers from a microelectronic workpiece. For purposes of the present application, a microelectronic workpiece is defined to include a workpiece formed from a substrate upon which microelectronic circuits or components, data storage elements or layers, and/or micro-mechanical elements are formed. Although the present invention will be described with respect to electrochemical etching, it will be recognized that many of the principles set forth herein are also applicable to other electrochemical tools and reactors.

FIG. 1, labeled "prior art," illustrates the background art of electrochemical etching. The apparatus shown is a basic electrochemical etching cell. A tank T holds liquid electrolyte E, which is typically an aqueous solution of a salt. Two electrodes, the anode A and the cathode C, are wired to a voltage source such as a battery B. When the apparatus is electrified, metal atoms in the anode A are ionized by the electricity and forced out of the metal into the solution, which, in turn, causes the metal anode A to dissolve into the aqueous solution. The rate of dissolution is proportional to the electric current, according to Faraday's law. Depending on the chemistry of the metals and salt, the metal ions from the cathode either plate the cathode, fall out as precipitate, or stay in solution.

Different types of electrochemical etching apparatus are described in the literature, but most are based on the foregoing principles. In conventional electrochemical etching reactors, the cathode is a shaped tool held close to the anode. The cathode is slowly moved over the face of the workpiece while electrolyte is pumped into the interstitial gap between the cathode and the workpiece, which is connected as the anode. Due to electrical field effects, the highest dissolution rates on the workpiece surface are in those places where the cathode has closely approached the anode surface. The rate falls off as the distance between the anode and the cathode increases.

By choosing proper electrolyte and electrical conditions electropolished surfaces can be achieved in electrochemical etching. As the name implies, electropolishing creates a very smooth mirror-like surface, said to be specular or bright, whose roughness is smaller than a wavelength of light. Unlike a mechanically polished surface, an electropolished surface has no built-up stress left by the high pressures of machining and mechanical polishing. The conductive metal may be selectively or completely etched from the surface of the workpiece. In the microelectronic industry, for example, electrochemical etching is used for through-mask patterning and for removal of continuous thin film conducting metals, such as seed layers, from the surface of a workpiece, such as a semiconductor wafer.

In electrochemical etching processes, the material being removed provides the conductive path for supplying a necessary portion of the processing power. As a result, the removal of material must be performed in a generally controlled manner. Attempts to concurrently remove the entire conductive surface of the workpiece may result in the etching away of portions of the conductive layer located proximate the source of processing power before areas located remote from the processing power source are removed. Remote areas would therefore become electrically isolated from the processing power prior to the completion of the electrochemical etch in those areas. By selectively applying the etching process, the likelihood of the day at a region will be electrically isolated is significantly reduced.

In the foregoing apparatus, material that is removed from surface of the workpiece will migrate to conductive surfaces of the electrode that is used to etch the workpiece material ("the etching electrode"). As the number of workpieces processed increases, the amount of material that collects on the etching electrode will likewise increase. This buildup of conductive material may have a significant effect on the uniformity of the surface of the etching electrode. Additionally, the buildup of material may interfere with the free-flow of electrolyte through nozzle openings of the etching electrode that are provided to supply a flow of electrolyte to the surface of the workpiece.

The non-uniformity resulting from the material build-up alters the gap distance between the anode, formed by the surface of the workpiece, and the cathode formed by the etching electrode. These non-uniformities, in turn, result in a corresponding non-uniformity in the electric field between the workpiece and etching electrode. The electric field variations give rise to uneven etch rates. As the variations in the uniformity of the etch rate increase, so does the chance that portions of the workpiece surface may become electrically isolated from the source of processing power prior to completion of the etching process in those areas. Further, such variations cannot be tolerated in processes that require highly uniform etched surfaces, such as in electrochemical planarization.

Another factor that can affect the uniformity of the current density and, consequently, the uniformity of the etching rate, is the change in the area of the workpiece that is exposed to the etching electrode as the etching electrode is swept across the workpiece. The degree to which this changing area affects the etching rate is dependent on the relative shape of both the workpiece and etching electrode. For example, this etching rate dependency occurs when a circular wafer is swept by a paddle-shaped etching electrode assembly having a rectangular etching electrode. Initially, as the rectangular etching electrode begins to move across the surface of the workpiece, it intersects a first edge of the wafer. In most reactors, the rectangular etching electrode assembly intersects the workpiece at a point that is approximately at the center of the rectangular electrode. As the rectangular etching electrode moves toward the center of the workpiece, the area over which the etching electrode and the workpiece surface are exposed to one another increases. When the rectangular etching electrode is positioned proximate the center of the workpiece, the area of exposure is typically at its maximum value. As the etching electrode continues to move across the workpiece, away from the center of the workpiece, the area of exposure again begins to decrease until the etching electrode completes it movement to the opposite edge of the workpiece. The varying area of exposure between the workpiece and the etching electrode can have a significant detrimental effect on current densities and etch rates and, thus, have a corresponding detrimental effect on the desired results of the etching process.

The present inventors have recognized many of the problems associated with electrochemical etching reactors and processes employing existing microfabrication facilities. One or more of these problems are addressed in the exemplary processing tool set forth herein that includes an improved electrochemical etching reactor.

BRIEF SUMMARY OF THE INVENTION

Although there are several inventions disclosed herein, the present application is directed to a reactor for electrochemically processing a microelectronic workpiece. The reactor comprises a movable electrode assembly that is disposed for movement along a motion path. The motion path includes at least a portion thereof over which the electrode assembly is positioned for processing at least one surface of the microelectronic workpiece. A cleaning electrode is located along the motion path of the movable electrode assembly. In one embodiment, a programmable controller is connected to direct the movable electrode assembly to move to the cleaning electrode during a cleaning cycle. At that time, the programmable controller connects the movable electrode assembly as an anode and the cleaning electrode as a cathode for cleaning of the movable electrode assembly. The cleaning electrode may be disposed along a position of the motion path that is beyond the range of motion required to process the microelectronic workpiece so that the programmable controller may be programmed to conduct a cleaning cycle while a microelectronic workpiece is present in the reactor for processing.

BRIEF DESCRIPTION OF THE SEVERAL VIEWS OF THE DRAWINGS

FIGS. 4B, 4C and 4D are further views of the electrode assembly shown in FIG. 4A.

FIG. 6 is a plan view illustrating a silhouette of a circular workpiece superimposed upon multiple electrode assembly positions, where the positions represent movement of the electrode assembly along the length of the workpiece during processing.

FIGS. 7A and 7B illustrate one embodiment of a gap adjustment mechanism that may be used in the reactor of FIG. 2.

FIGS. 8A and 8B illustrate one embodiment of a spring float assembly that may be used in the compliant mounting used in the reactor base of all of the reactor shown in FIG. 2.

FIGS. 14a through 14C illustrate one embodiment of a handle that may be used with the tray of FIGS. 13A and 13B.

DETAILED DESCRIPTION OF THE INVENTION

Figure 1:
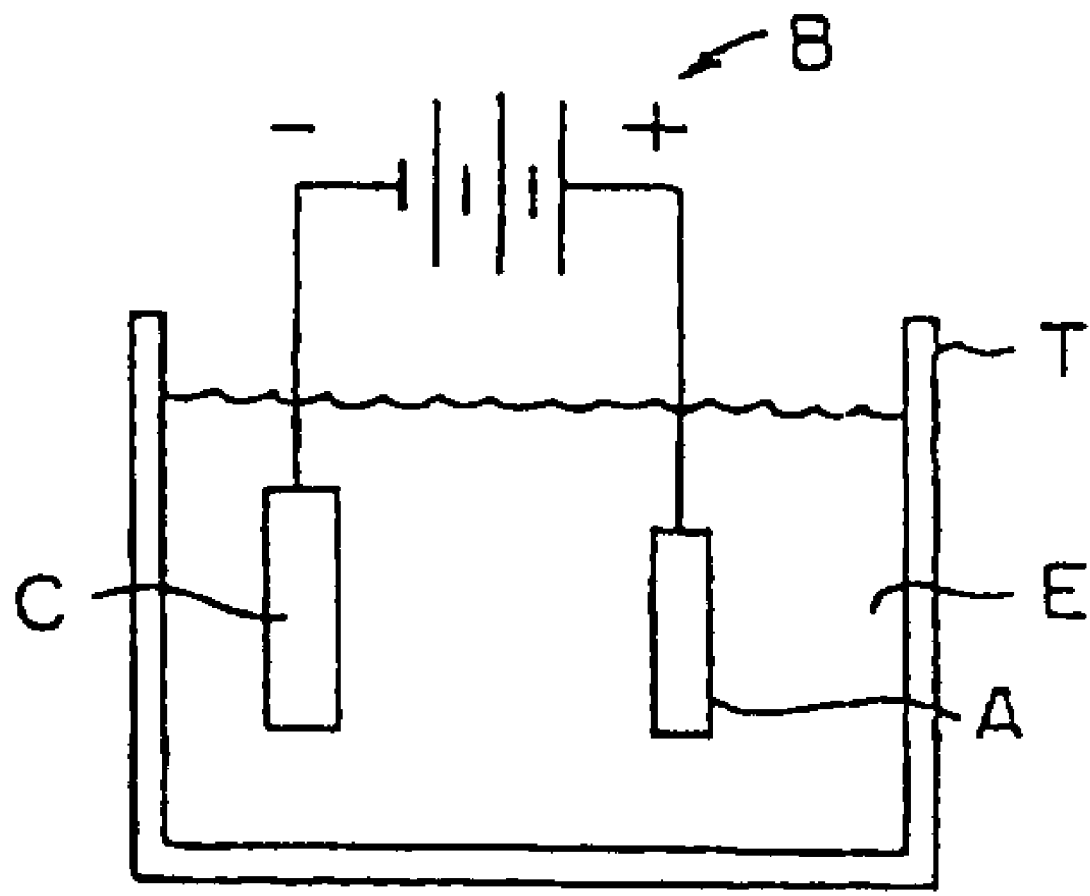
FIG. 1 is a schematic diagram of the components of the basic electrolytic cell that may be used to electrochemically etch a surface layer of a workpiece.
Figure 2:
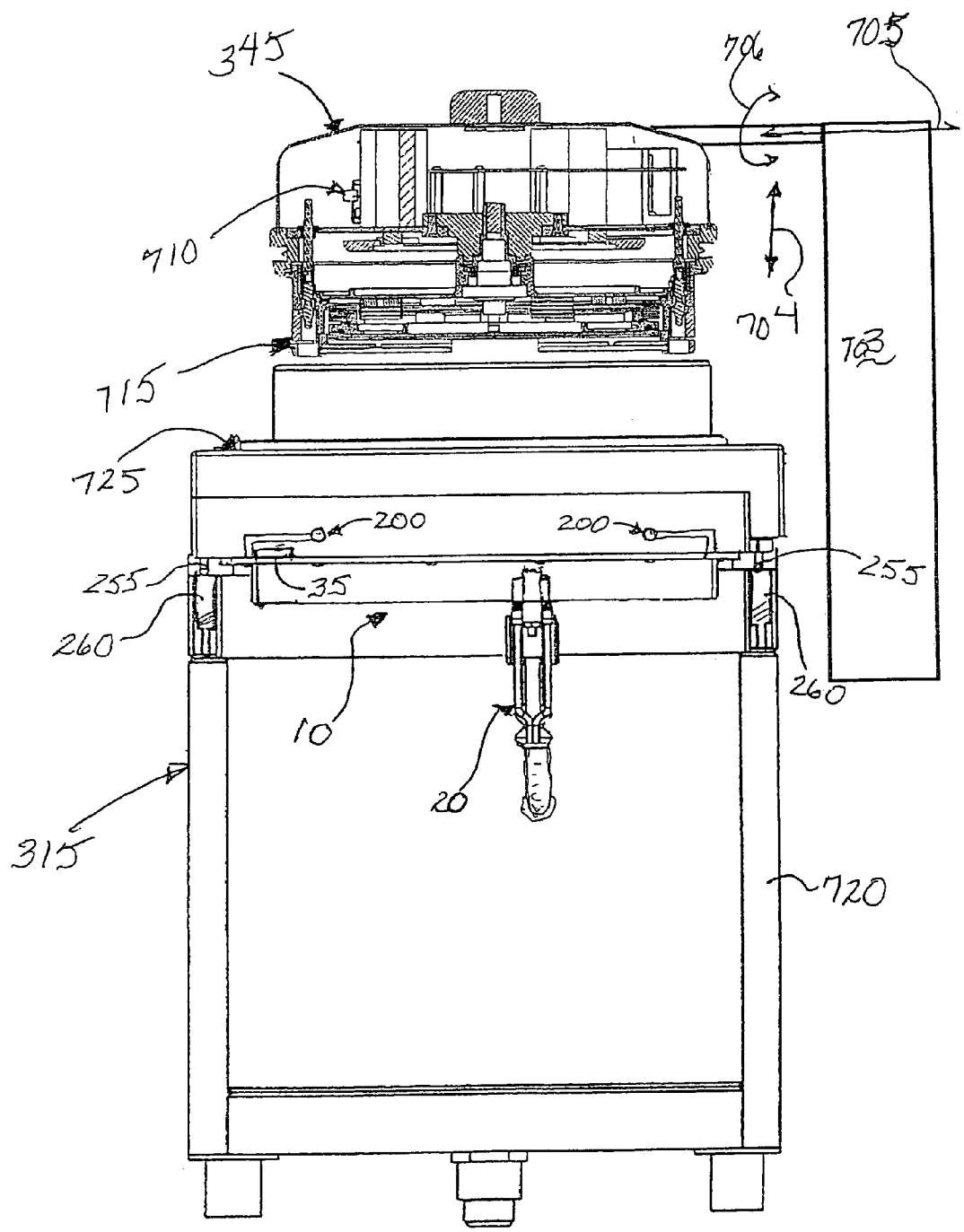
FIG. 2 is a basic cross-sectional view of an electrochemical etching reactor constructed in accordance with one embodiment of the present invention.

FIG. 2 illustrates an electrochemical etching reactor constructed in accordance with one embodiment of the present invention. The reactor, shown generally at 1, includes a reactor head assembly 345 and a reactor base 315. The reactor my be incorporated in an integrated tool with other reactors that execute the same or ancillary processes used in the microfabrication of micro-sized devices and/or components. For example, the reactor may be included in a multiple station tool such as the LT-210C™ or EquinoX™ tools available from Semitool, Inc. of Kalsipell, Mont.

The reactor head assembly 345 may be connected to a lift mechanism 703 to drive the reactor head vertically in the directions noted by the arrows 704. For example, lift mechanism 3 may drive the reactor head assembly 345 between a first position (not illustrated) in which it cooperates with the reactor base assembly 345 to define the controlled processing environment and a second position (illustrated in FIG. 2) in which the reactor head assembly 345 is separated from the reactor base assembly 315. In the second position, a workpiece that is to be processed or that has been processed may be loaded or unloaded from the reactor head assembly 345. To facilitate the loading and/or unloading process, the lift mechanism 703 may also include one or more actuators that rotate the reactor head assembly 345 in the directions noted by arrows 706 about the horizontal axis illustrated at arrows 705.

In the illustrated embodiment, the reactor head assembly 345 includes the principal components that are used to load and unload the workpiece as well as those components that are used to provide processing power to the workpiece. To this end, reactor head assembly 345 includes an actuator section 710 and a workpiece contact section 715. As will be set forth in further detail below, the actuator section 710 includes those components that are used to open and close the components of the contact section 715 for loading and unloading the workpiece, while workpiece contact section 715 includes those components that are used to support the workpiece and conduct electrical power to it during processing. The actuator section 710 may also include electrical circuits used to test the resistance of the surface that is to be electrochemically etched to either set the electrical parameters that are to be used for the processing and/or to insure that the workpiece meets certain parameters before it is processed.

Depending on the particular process requirements, reactor base 315 may serve as a reservoir that is filled with an electrolyte. In such instances, the reactor head assembly 345 is driven to a processing position in which at least one surface of the workpiece makes contact with the fluid surface of the electrolyte. In the embodiment shown here, however, reactor base 315 is not filled with electrolyte. Rather, it cooperates with the reactor head assembly 345 to provide a controlled processing environment in which electrochemical etching may take place. It may also include a drain to remove the electrolyte after it has been utilized in the etching process.

Generally stated, the reactor base assembly 315 of the illustrated embodiment comprised of a chamber portion 720 and a head engagement portion 725. The head engagement portion 725 includes an etch assembly, shown generally at 10, having an electrode assembly 20 that is driven linearly in the directions noted by arrows 721. As will be set forth in further detail below, the electrode assembly 20 includes at least one conductive plate that serves as the cathode during electrochemical etching. Further, the electrode assembly 20 of the disclosed embodiment serves to provide a flow of electrolyte that spans the interstitial region between the conductive plate and the workpiece. In this arrangement, the surface of the workpiece that is to be electrochemically etched serves as the anode.

As noted above in connection with known electrochemical etching reactors, the spacing between the cathode and the surface of the workpiece is often critical to the uniformity of the etching process. As such, the etch assembly 10 is provided with one or more gap adjustment mechanisms, shown generally at 200. In operation, the contact portion 715 of the reactor head assembly 345 includes structures that align with end portions of the gap adjustment mechanisms 200 so that the contact portion 715 and the etch assembly 10 properly register with one another. Since the workpiece is carried by the contact portion 715 and the electrode assembly 20 is carried by the etch assembly 10, the gap adjustment mechanisms 200 serve to initially provide and thereafter maintain the electrode of the electrode assembly 20 and the surface of the workpiece at a predetermined distance from one another.

To ensure that the gap adjustment mechanisms 200 do not deviate to any substantial degree from their predetermined positions when the etch assembly 10 and the reactor head assembly 345 are registered with one another, head engagement portion 725 of the reactor base assembly 315 is compliantly mounted to the chamber portion 720. In the illustrated embodiment, this compliant mounting is provided by cooperating float mechanism/pin pairs. With reference to FIG. 2, the reactor includes one or more float mechanisms 260 in fixed engagement with the chamber portion 720 that engage respective pins 255 that are in fixed engagement with the head engagement portion 725. The specific details relating to one embodiment of a float mechanism 260 and corresponding pin 255 are set forth below.

During electrochemical etching, the etch material may build-up on the cathode thereby altering the desired distance between the cathode and the surface of the workpiece. This becomes a particularly onerous problem when the reactor is used to electrochemically etch, large volumes of workpieces in a production environment. Accordingly, etch assembly 10 is provided with a cleaning electrode 35 and may be programmed to execute a cleaning cycle after processing a single workpiece, after processing a predetermined number of workpieces, or during a single processing cycle. During a cleaning cycle, electrode assembly 20 is driven to a position in which the conductive plate thereof is adjacent the cleaning electrode 35. Electrical power is then provided between the conductive plate and the cleaning electrode while a flow of electrolyte or other electrically conductive solution is maintained between them. The electrical power is provided during this cleaning cycle so that the cleaning electrode 35 operates as a cathode and the conductive plate of the electrode assembly 20 operates as an anode. In this operation, the material at the surface of the conductive plate is removed thereby leaving the conductive plate in a state in which workpiece-to-workpiece processing is substantially uniform and is not generally dependent on the total number of workpieces processed by the reactor. The cleaning electrode may, for example, be formed from platinum plated titanium or some other inert material.

Figure 3A:
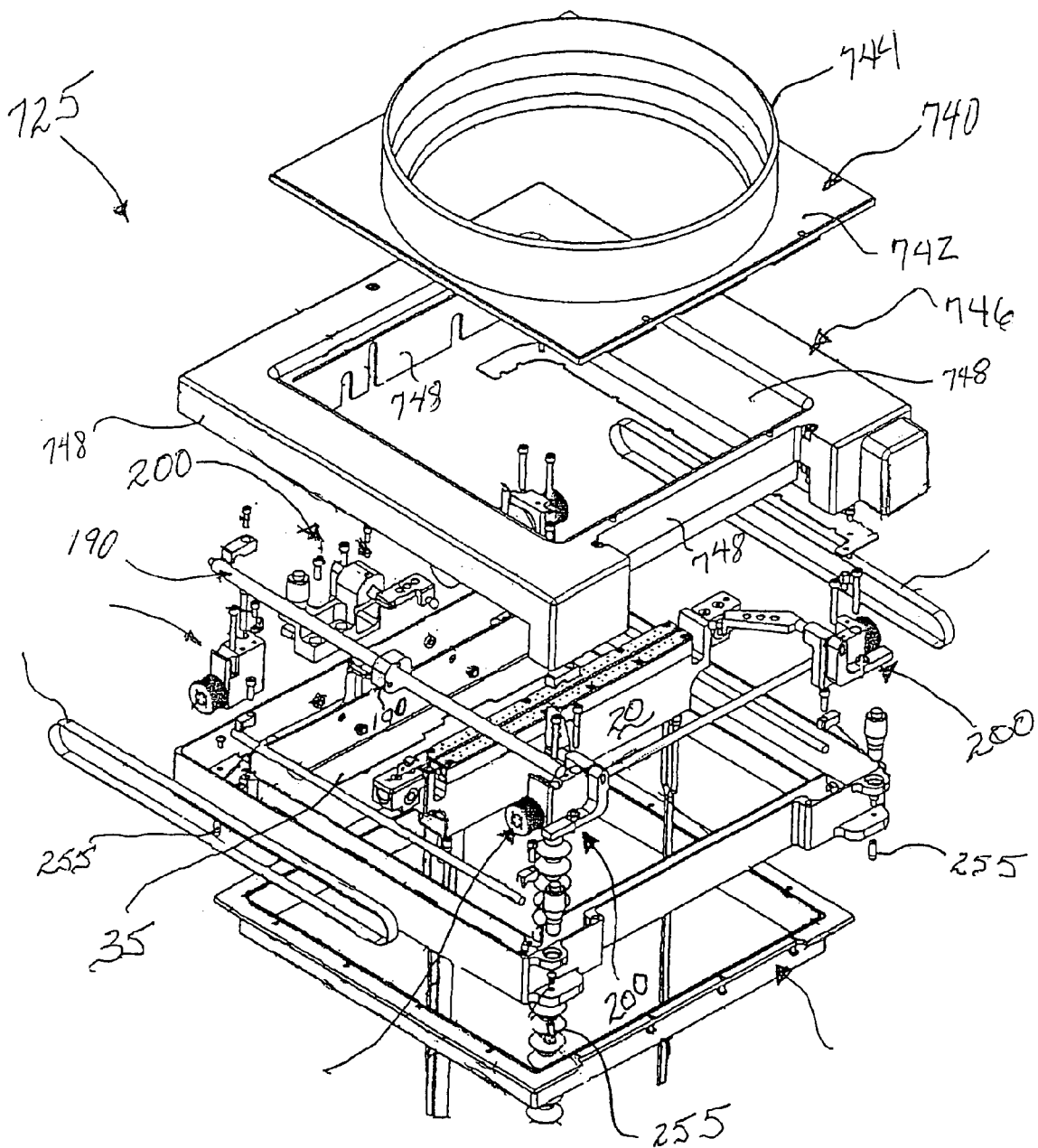
FIG. 3A used and exploded view of one embodiment of the head engagement assembly used in the reactor of FIG. 2.

FIG. 3A is an exploded view of one embodiment of the head engagement portion 725 of the reactor base assembly 315 that is suitable for use in the reactor of FIG. 2. As shown in FIG. 3A, the head engagement portion 725 includes a top cover 740 having a rectangular flange 742 and an upstanding circular rim 744 that defines a central aperture. The rim 744 and central aperture has a diameter that is large enough to allow at least the contact portion 715 of the reactor head 345 to extend therethrough so that the workpiece may be placed proximate the electrode assembly 20 for processing.

The top cover 740 is secured to an upper surface of an intermediate cover 746. The intermediate cover 746 includes a plurality of downward depending sidewalls 748 that extend into engagement with a bottom cover 752. Together, the intermediate cover 746 and bottom cover 752 cooperate to define one or more chambers that hold the components used to drive the electrode assembly 20. Such an arrangement assists in isolating the components from the reactive chemicals that are typically used for processing. Further, this arrangement assists in preventing contaminants generated by the drive components from entering and fouling the processing of the workpiece.

Figure 3B:
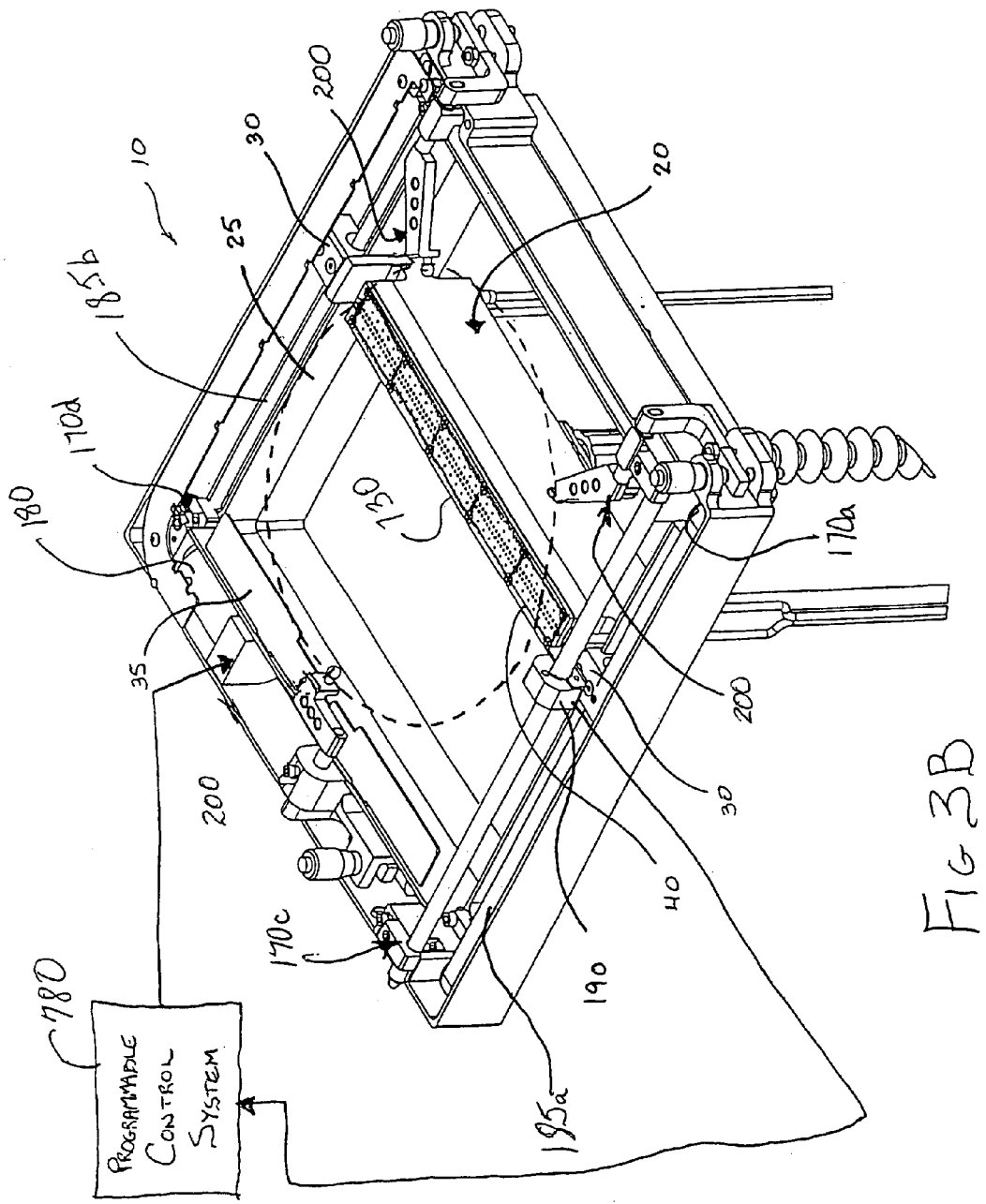
FIG. 3B is a perspective view of one embodiment of an etching assembly constructed in accordance with the present invention.

FIG. 3B is a perspective view of one embodiment of an etch assembly 10, the components of which are also shown in an expanded form in FIG. 3A.

In the illustrated embodiment, the etch assembly 10 includes an electrode assembly 20 having a rectangular plan surface 730 that faces a lower surface of a microelectronic workpiece 25, shown here by dashed lines as a disk-shaped semiconductor wafer. Although reference is made to one particular shape of workpiece, one skilled in the art will readily appreciate, that workpieces having alternative shapes could also be used without departing from the teachings of the present invention.

As shown in both FIGS. 3A and 3B, three gap adjustment mechanisms 200 are spaced at equal angular distances with respect to the workpiece 25. When the contact portion 715 of the reactor head assembly 345 engages the gap adjustment mechanisms 200, the workpiece 25 rests along a plane that is parallel to the plane defined by these three points of engagement. Alternatively, the contact portion 715 may be designed so that the portions thereof that are engaged by the gap adjustment mechanisms 200 are recessed a sufficient distance so that the workpiece rests directly along the plane defined by these three points of engagement. In either instance, this ensures that the planar face of the electrode assembly 20 and the lower surface of the workpiece 25 are properly spaced from one another.

Figure 3C:
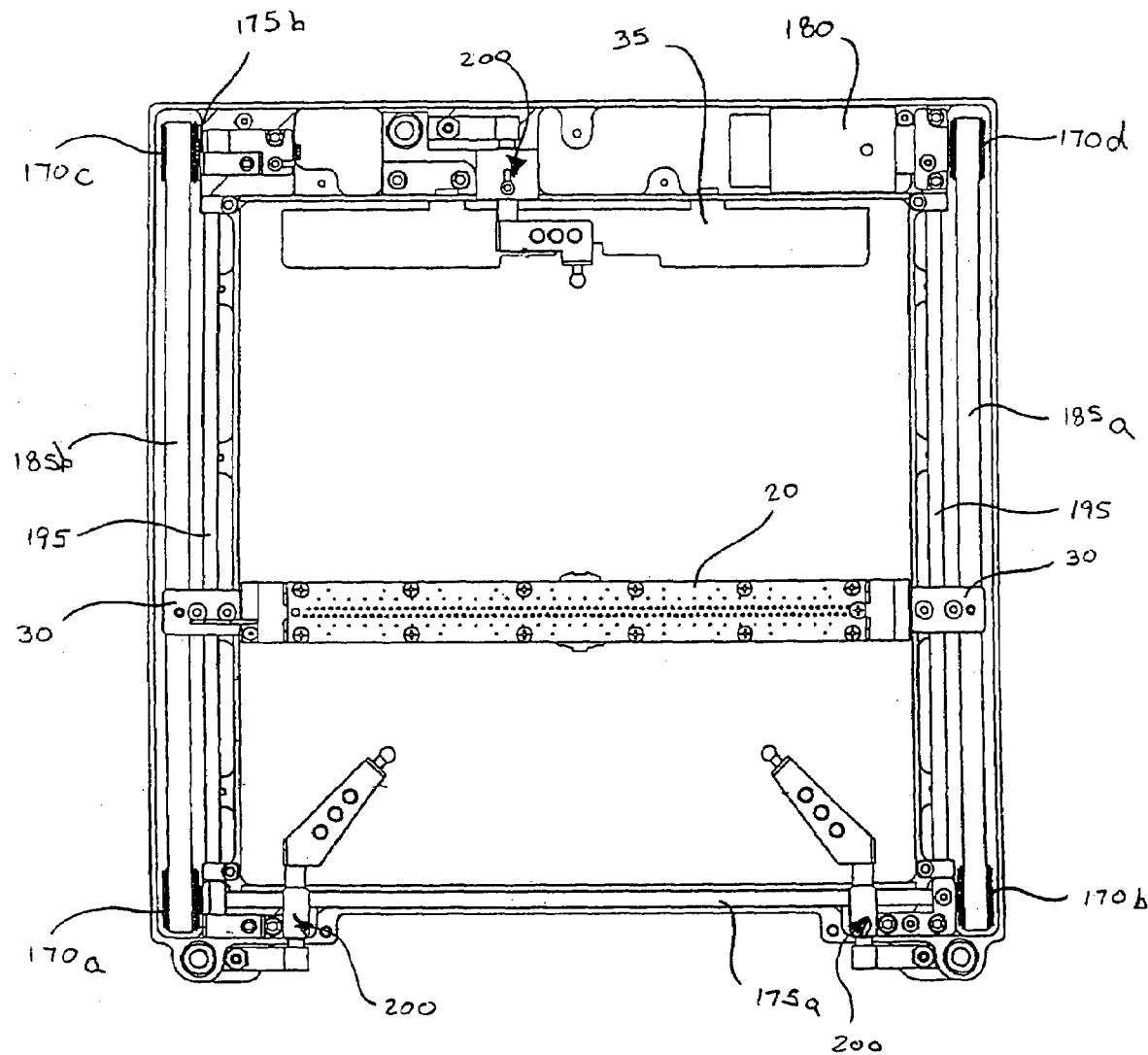
FIG. 3C is a bottom plan view of the etching assembly shown in FIG. 3B.

The electrode assembly 20 may be driven across the surface of the workpiece in a variety of manners. Here, the electrode assembly is driven linearly along the entire diameter of the workpiece 25 in order to process substantially the entire workpiece surface. With reference to FIGS. 3A, 3B and 3C, the electrode assembly 20 of the illustrated embodiment includes one or more connection tabs 30 that are connected to the drive mechanism. A first portion of each of the connection tabs 30 is connected to a corresponding drive belt 185, the details of which will be discussed below. A second portion of each of the connection tabs 30 engages a corresponding guide rod 195 along which the electrode assembly 20 is driven during processing. In operation, the guide rods 195 assist in ensuring fluid and accurate motion of the electrode assembly 20 along its motion path. The guide rods 195 additionally help to maintain a consistent relative spacing between the surface of an electrode assembly 20 and the nearby workpiece 25.

With particular reference to FIG. 3C, the electrode assembly 20 is driven along guide rods 195 by a drive mechanism that includes a set of four pulleys 170a-b, each pulley being located at a respective corner of the etch assembly 10. The pulleys 170a-c ride upon corresponding pulley rods 175a and 175b, with pulleys 170a and 170b sharing common pulley 175a. Pulley 170 is connected so that it is directly driven by a motor 180.

The pulleys 170b and 170d are coupled to one another by drive belt 185a while pulleys 170a and 170c are coupled to one another by drive belt 185b. As such, the rotational motion imposed on pulley 170d by motor 180 is imparted to all of the remaining pulleys 170a-c. This motion, in turn, is imparted as a linear movement of the electrode assembly 20 since it is attached at connection tabs 30 to the drive belts 185. In the illustrated embodiment, the gear ratios of the pulleys are one to one with respect to one another. As such, the relative rates of movement of the pulleys 170a-d and the corresponding movement of the drive belts 185a and 185b are substantially identical.

The position of the electrode assembly 20 along its motion path may be detected and controlled in a variety of manners. In the illustrated embodiment, a position sensor 190 is attached to one of the connection tabs 30 so that it moves linearly along the motion path with the electrode assembly 20. As the electrode assembly is driven along the motion path, the position sensor 190 provides an encoded signal whose value corresponds to the electrode assembly's absolute position. By decoding the signal received from the position sensor 190, the position of the electrode assembly 20 can be tracked. Such decoding may be accomplished by providing the encoded signal to a programmable control system, shown generally at 780 of FIG. 3B. A programmable control system 780, in turn, may be connected to drive the motor 180 in response to the decoded position of the electrode assembly. 20.

The cleaning electrode 35 of the illustrated embodiment is disposed along the motion path of the electrode assembly 20 and is positioned beyond the range of movement required to process the workpiece 25. This allows the electrode assembly 20 to be cleaned even when a workpiece 25 is present. Further, depending on the processing requirements, the programmable control system 780 may be programmed so that cleaning operations are conducted as part of the processing of a single workpiece. For example, if the material that is electrochemically etched from the surface of the workpiece builds up quickly as a single workpiece is processed, a cleaning cycle may be scheduled mid-way (or at some other predetermined point) through the processing of the single workpiece.

The particular construction of one embodiment of an electrode assembly 20 suitable for use in the reactor of FIG. 2 is illustrated in FIGS. 4A through 4D. As shown, the electrode assembly 20 includes a top portion 45 and a bottom portion 50. The top portion 45 includes a top surface having one or more conductive segments 40. The bottom portion 50 is adapted for coupling to one or more fluid and/or electrical supply lines. For example, the bottom portion 50 may be coupled to one or more fluid sources or drains, electrical sources for receiving processing power, and/or vacuum sources for inducing pressure differentials at the surface of the electrode assembly 20. In the illustrated embodiment, a number of different lines are provided to the bottom portion 50. A first source of fluid is supplied to the electrode assembly 20 via a flexible tube 55 that is coupled proximate the center of the bottom portion 50. A second source of fluid is provided by a pair of fluid supply lines 60 located near a first end of the electrode assembly 20. A source of vacuum is coupled to a second end of the electrode assembly 20 by a pair of vacuum supply lines 65. Finally, an electrical source providing processing power is coupled to the electrode assembly 20 via an electrical connection 70 located proximate the vacuum supply lines 65.

The flexible tube 55 is connected to a reservoir containing processing fluid through a pump for supplying the processing fluid to the surface of the electrode assembly 20. Processing fluid provided through the flexible tube 55 is received by a central chamber 75 located within the bottom portion 50 of the electrode assembly 20. The central chamber 75 distributes the fluid lengthwise across the electrode assembly 20. From the central chamber 75, the fluid enters the top portion 45 of the electrode assembly 20 through a diffuser plate 80 (FIGS. 4C and 4D). As particularly shown in FIG. 4D, the top portion 45 includes a protrusion 85, sized and shaped to correspond to the top opening of the central chamber 75, that is received by the central chamber, and upon which the diffuser plate 80 is connected. A gasket 90 located around the periphery of the protrusion 85 seals against the internal sidewall surface of the central chamber 75, thereby effectively restricting fluid flow between the peripheral surface of the protrusion 85 and the sidewall surface of the central chamber 75.

In the illustrated embodiment, the diffuser plate 80, as shown in FIG. 4D, includes a series of openings that span the length of the electrode assembly 20. These openings are smaller proximate the center of the electrode assembly 20 compared to the size of the openings at the end portions thereof. As such, the fluid flow from the bottom portion 50 to the top portion 45 is more restricted proximate the point where the fluid is supplied to the electrode assembly 20 (here, the point of connection with flexible tube 55) and less restricted further away from the initial source of the fluid. This assists in ensuring a generally uniform fluid pressure through chamber 75 thereby providing for an even distribution of the fluid flow to the workpiece across the entire length of the electrode assembly 20.

After the fluid flows through the diffuser plate 80, it enters one of the supply channels 100 located within a distribution portion 105 of the electrode assembly 20. From the supply channel 100, the fluid travels through openings 120 in a gasket 110 and exits the electrode assembly 20 through one or more fluid delivery ports 115 located at the upper surface of the electrode assembly 20.

A source of de-ionized water and a source of vacuum pressure are also provided through openings at the surface of the electrode assembly 20 in a manner that is somewhat similar to that described above for the processing fluid. The fluid supply lines 60 supply the de-ionized water and are connected to a pump that, in turn, is coupled to a reservoir containing de-ionized water. The supply lines 65 are connected to a source of vacuum pressure. For example, the supply lines 65 may be connected to an air aspirator through a fluid separator. In this manner, the fluids and the gases that are drawn in through the electrode assembly 20 from the processing environment may be separated from one another.

Figure 4A:
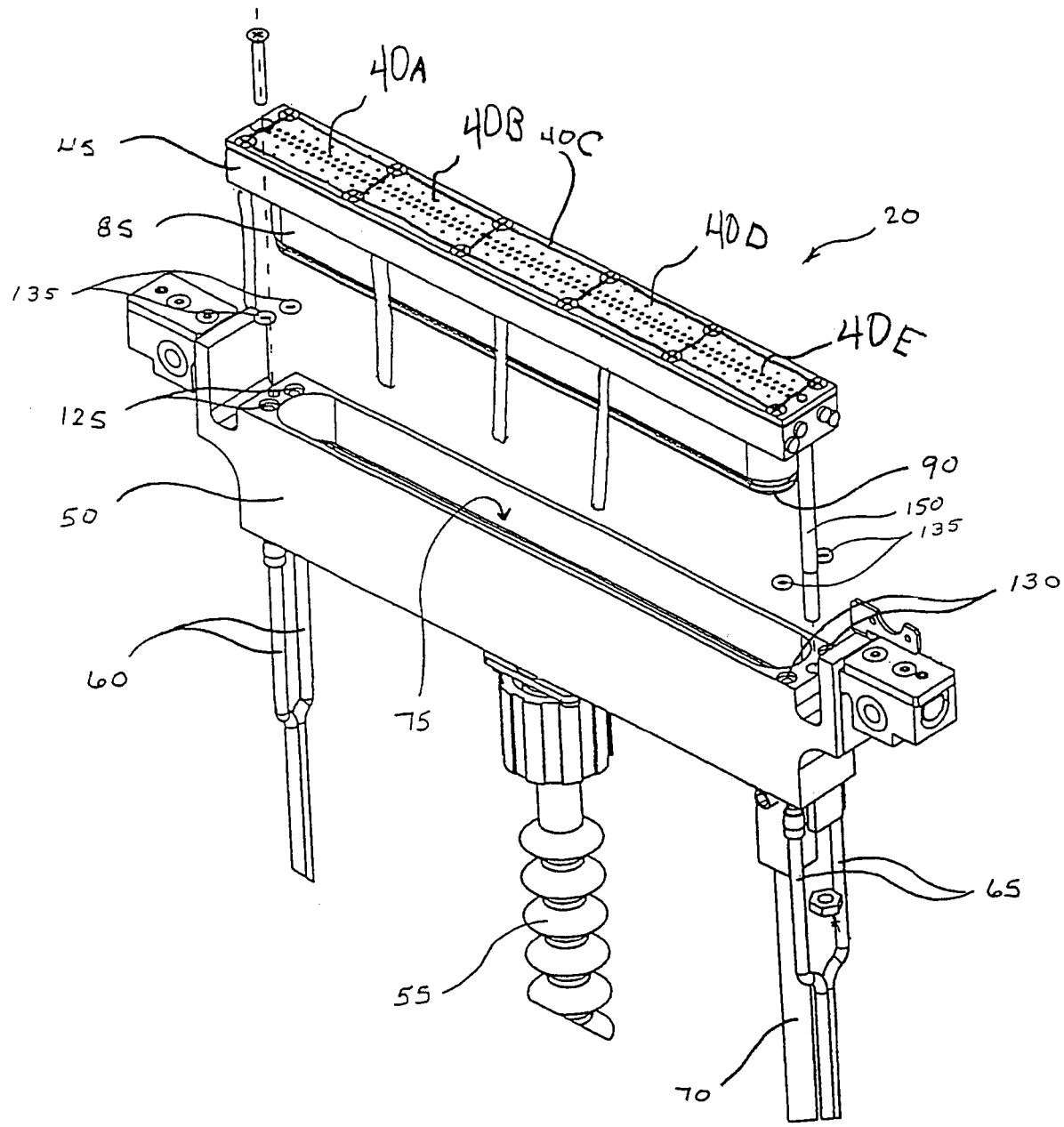
FIG. 4A is a perspective view of the components of one embodiment of an electrode assembly that may be used in the etch assembly of FIGS. 3A-3C.
Figure 4D:
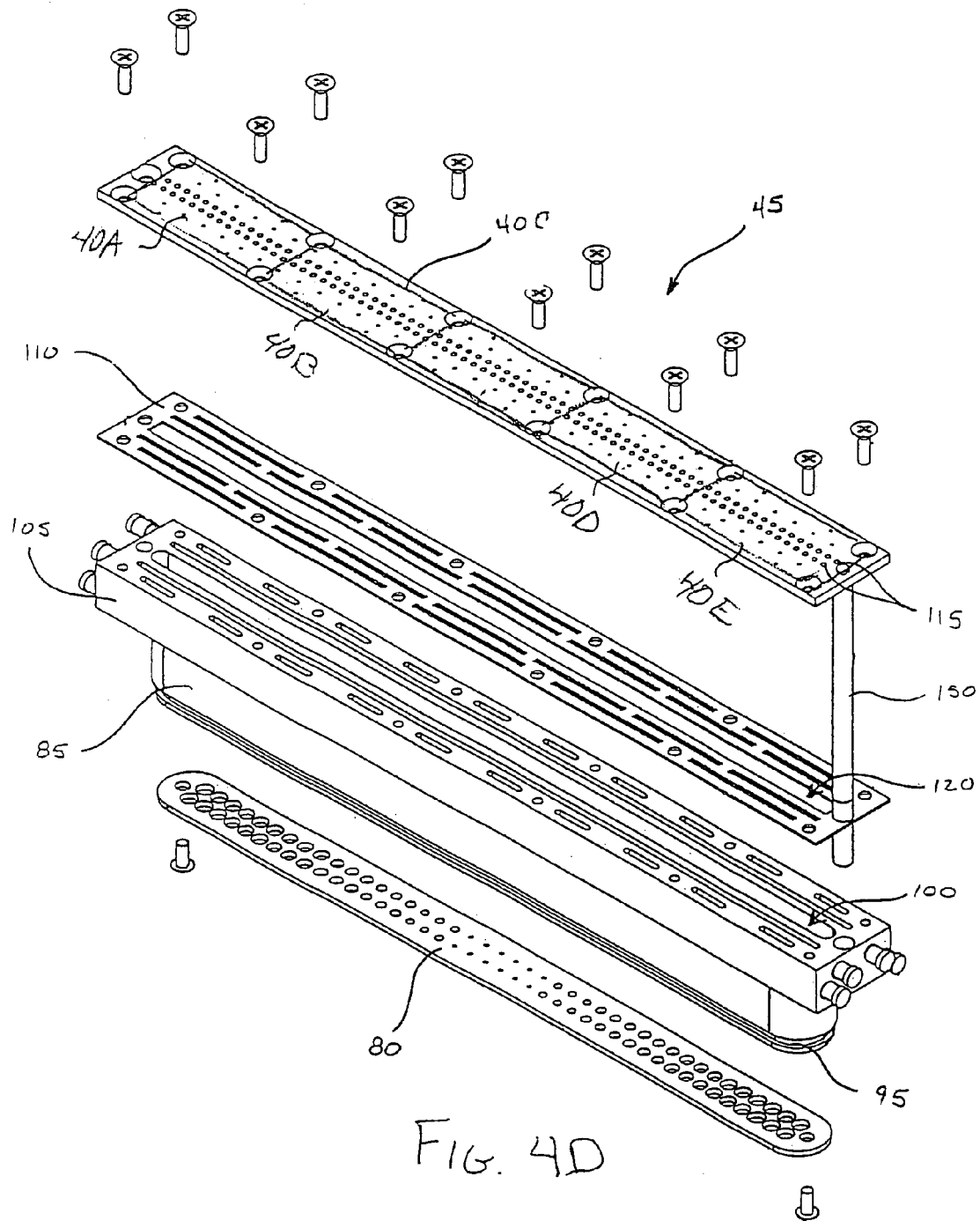

With reference to FIGS. 4A and 4C, the de-ionized water and the vacuum pressure are supplied through vertical passageways 125 and 130, respectively. As shown, the vertical passageways 125 and 130 are disposed at opposite ends of the electrode assembly 20. The passageways 125, 130 each begin where the respective supply lines 60 and 65 connect to the electrode assembly 20 and extend through the bottom portion 50, into the top portion 45 where they open to a corresponding manifold channel 103, 107 in the fluid distribution portion 105 of the electrode assembly 20. At the point where passageways 125, 130 transition between the bottom portion 50 and the top portion 45, O-ring seals 135 are provided to limit leakage outside of the passageways 125, 130 prior to opening into the corresponding manifold channel 103, 107.

The manifold channels 103, 107 distribute the de-ionized water and the vacuum supply respectively to one or more fluid delivery ports 140 and one or more fluid recovery ports 145. In the illustrated embodiment, the electrode assembly 20 includes two sets of fluid delivery ports 140 for de-ionized water, and two sets of fluid recovery ports 145.

The surface of the electrode assembly 20 may be in the form of a single, continuous electrode. However, the surface of the electrode assembly 20 of the illustrated embodiment is comprised of a plurality of individual conductive segments 40A through 40E that are electrically isolated from one another (in the absence of an electrolyte or other conductive liquid). Electrical power is provided from an external power supply to these segments through respective conductive rods 150A through 150E. As will be explained in further detail below, electrical power to these individual segments may be controlled during processing based on the area of the electrode assembly 20 surface that is exposed to the surface of the workpiece under process.

Figure 5:
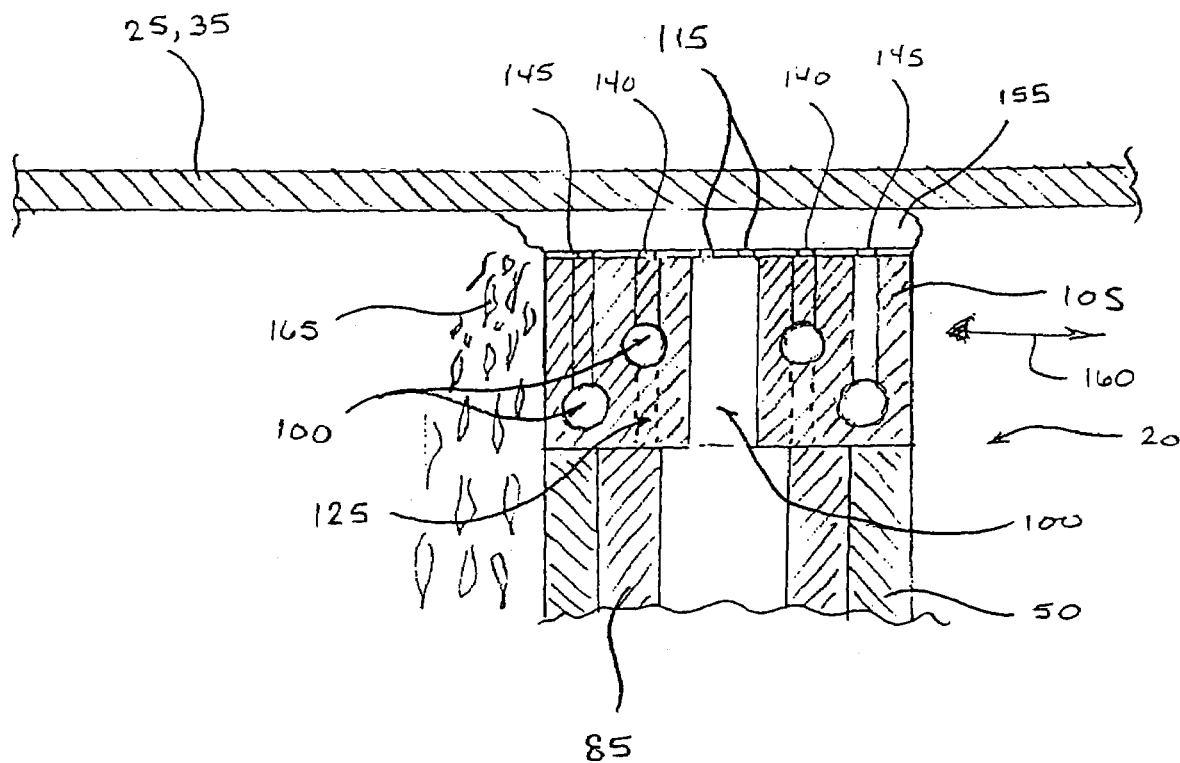
FIG. 5 illustrates operation of the etching assembly of the foregoing figures as it is moved adjacent to the surface of a workpiece that is under process.

FIG. 5 illustrates operation of the electrode assembly 20 when it is proximate a surface, such as the surface of the workpiece 25 or the surface of the cleaning electrode 35. As shown, a fluid 155 is provided from the electrode assembly 20 and fills the interstitial region between the workpiece 25 and the surface of the electrode assembly 20. This fluid 155 may be, for example, electrolyte (used in an electrochemical etch process or electrochemical deposition), de-ionized water, etc.

The fluid 155 may be handled in a variety of different manners after it has contacted the surface of the workpiece 25 or the surface of the cleaning electrode 35. For example, the fluid may be allowed to enter the chamber of the base assembly 315. Alternatively, the fluid may be recovered via the suction force provided by the fluid recovery ports 145. This can be especially useful where multiple types of fluids are employed for processing and/or contact cleaning. In such instances, mixing of the various fluid types in the base assembly 315 may be undesirable. Further, it may be desirable to recover the fluid through ports 145 for replenishment, recycling, etc.

Given the manner in which the operation of the electrode assembly 20 is shown in FIG. 5, it is clear that the electrode assembly is in motion and proceeding to the right hand side of the drawing. However, arrows 160 indicate the potential for bi-directional movement of the electrode assembly 20 during processing. In order to facilitate fluid recovery regardless of the direction in which the electrode assembly 20 travels, two sets of fluid recovery ports 145 are employed in the illustrated embodiment. The fluid recovery port sets are located exterior to and on opposite sides of the fluid delivery ports 140.

Generally stated, the fluid is retained within the gap between the surface of the electrode assembly 20 and the corresponding surface of the workpiece or cleaning electrode when the volume of processing fluid provided to the surface does not exceed the volume of fluid that can be supported by the surface tension forces. With this in mind, it will be recognized that the rate at which the de-ionized water, or any other fluid, is recovered through the fluid recovery ports 145 should take account of the rate at which the de-ionized water is provided through the fluid delivery ports 140.

FIG. 6 illustrates the relative area of engagement between electrode assembly 20 and a disk-shaped microelectronic workpiece 25 as the electrode assembly 20 is moved during workpiece processing. At each position, designated by the electrode assembly positions 20A-20C, it can be seen that the area of the electrode assembly 20 that overlies the surface of the workpiece 25 varies as the electrode assembly 20 is moved along the length of the workpiece. If a single, continuous conductive element is used at the surface of the electrode assembly 20, processing power is provided across the entire length of the assembly regardless of the area of exposure. This can create electric field fringe effects that vary as the electrode assembly 20 is moved across the workpiece during processing. Depending on the processing requirements, such fringe effect may have a detrimental effect on the overall uniformity of the process. To avoid or otherwise control these fringe effects, each of the conductive segments 40A through 40E may be connected to individually controlled outputs of a power control system, shown schematically at 792. Power control system 792 may take any number of forms. For example, power control system 792 may include a programmable controller, a standard power supply, and a power distribution circuit that is controlled by the programmable controller. Other configurations are likewise suitable.

The manner in which power is controlled for each of the segments 40A through 40E is process dependent. However, some of the ways in which power may be controlled are set forth in Table 1 below.

TABLE 1

| POSITION | POWER |
| --- | --- |
| 20A | Segment 40A and Segment 40E have no exposure to the workpiece. No processing power to these segments. |
| 20B | Segment 40B and Segment 40D have minimal exposure to the workpiece. At least three possible alternatives exist: 1 - No processing power is provided to segments 40B and 40D, as the amount of exposure is very limited. 2 - Full processing power is provided to segments 40B and 40D since they at least partially overlie the workpiece. 3 - A limited level of processing power is provided to segments 40D and 40B to account for the limited exposure that these segments have with the workpiece 25. |
| 20C | Segment 40C, similar to Segments 40B and 40D, is only partially exposed, consequently the specific level of processing power which would be most beneficial may similarly vary |

As opposed to altering the amount of electroplating power provided to the electrode of the court to assembly, it may be possible to compensate for the electric field variations by altering the motion profile that is used by the electrode assembly as it moves across the face of the workpiece. For example, the electrode assembly may be moved quickly along the end portions of its motion path when compared to its motion as it traverses the middle portions of the workpiece.

A specific embodiment of the gap adjustment mechanisms 200 is illustrated in FIGS. 7A and 7B. As shown, the gap adjustment mechanisms 200 each include a base portion 205 having a pair of mounting holes 210 for attachment to the etch assembly 10. Each gap adjustment assembly 200 further includes an arm 215 that has a first end attached to an axle 22, and a second end connected to a pin 240 that terminates at a spherical head 245. It is the spherical head 245 advance in cages the appropriate portion of the contact portion of the reactor head assembly 345. As such, the particular shape and size of arm 215 is dependent on where and how far it must span to engage the corresponding section of the contact portion 715 of the reactor head assembly 345.

Axle 220 cooperates with the base portion 205 to form a fulcrum about which arm 215 may pivot. The other end of the axle 220 is coupled to a first end of a lever arm 225. Lever arm 225 is engaged at a second end thereof by an adjustable tip of a micrometer 230. The micrometer 230 is adjusted to pivot the lever arm 225 about axle 220 and thereby produce a corresponding raising and lowering of the spherical head 245. This allows the position of the contact portion 715 of the head assembly 345 (and, thus, the workpiece) to be spaced from the upper surface of the electrode assembly 20 with a high degree of accuracy.

A specific embodiment of the float assemblies 260 is illustrated in FIGS. 8A and 8B. As shown, each float assembly 260 includes a housing 265 having a central passageway 270, within which a spring float shaft 275 is received. One end of the spring float shaft 275 terminates at a flange 280 that is wider than the upper portion of the central passageway 270 thereby restricting motion of the shaft 275 past point 285. The shaft 275 is biased toward this point 285 by a spring 290 similarly located within the central passageway 270 of the housing 265. The end of the spring 290 opposite the point of contact with the shaft 275 is fixed with respect to the housing 265 by a retainer 295. In some instances a second retainer 295 can be used to further increase the compression of the spring 290.

The retainer 295, in turn, is held in place by a snap ring 300. The snap ring 300 is a discontinuous circular ring that may be squeezed to reduce its diameter. When deformed in this manner, the snap ring 300 can slide into the bottom opening 305 of the housing 265 past the more restrictive shaft diameter, and expand and fit within a groove 310 located in the wall of the central passageway 270 having a larger diameter, which is proximate to the opening 305.

While the spring float assembly 260 can be a separate assembly, as illustrated in connection with FIGS. 8A and 8B, the spring float assembly 260 can also be integrated as part of the reactor base assembly 315 or as part of the base plate of the processing station (not shown). Various other configurations can also be employed to provide a compliant connection between the head engagement portion 725 and the base portion 720 of the reactor base assembly 315.

Figure 9:
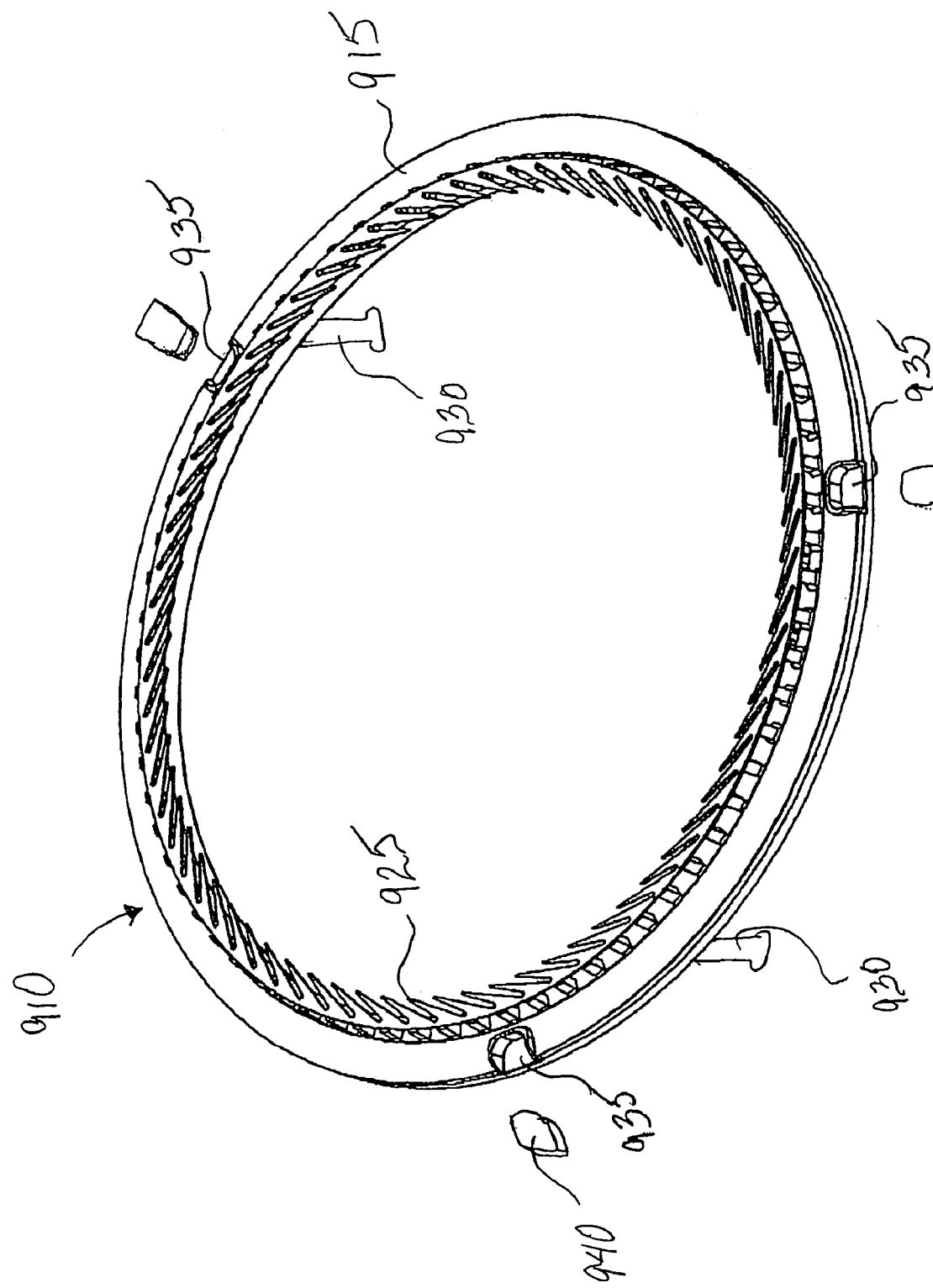
FIG. 9 illustrates a first embodiment of a contact assembly that may be used in the reactor head of the reactor shown in FIG. 2.

FIG. 9 illustrates one embodiment of a contact assembly 910 that may be used in the contact portion 715 apparatus of FIG. 2. Generally stated, contact assembly 910 includes an exteriorly disposed dielectric rim 915 and an interiorly disposed conductive ring 920 having a plurality of sawtooth-shaped contact 925. The contact assembly 910 may also include one or more connection members 930 that a used to secure the contact ring assembly 910 to the other components of the contact portion 715. Further details of this exemplary interconnection as well as of the contact assembly construction can be found in U.S. Ser. No. _____ filed Nov. 20, 2000, entitled "_____", which is hereby incorporated by reference.

Dielectric rim 915 includes a plurality of cut-out section 935 that are disposed for alignment with the spherical heads 245 of the gap adjustment mechanisms 200. Each cut-out section 935 is provided with a corresponding insert 940. It is the inserts 940 that are used to directly engage the spherical heads 245. Since the inserts 940 are formed as pieces that are separate from the rim 915, it is possible to form the dielectric rim 915 from a material that is less durable than would otherwise be required to sustain the wear and tear associated with frequent engagement of the gap adjustment mechanisms 200.

Figure 10:
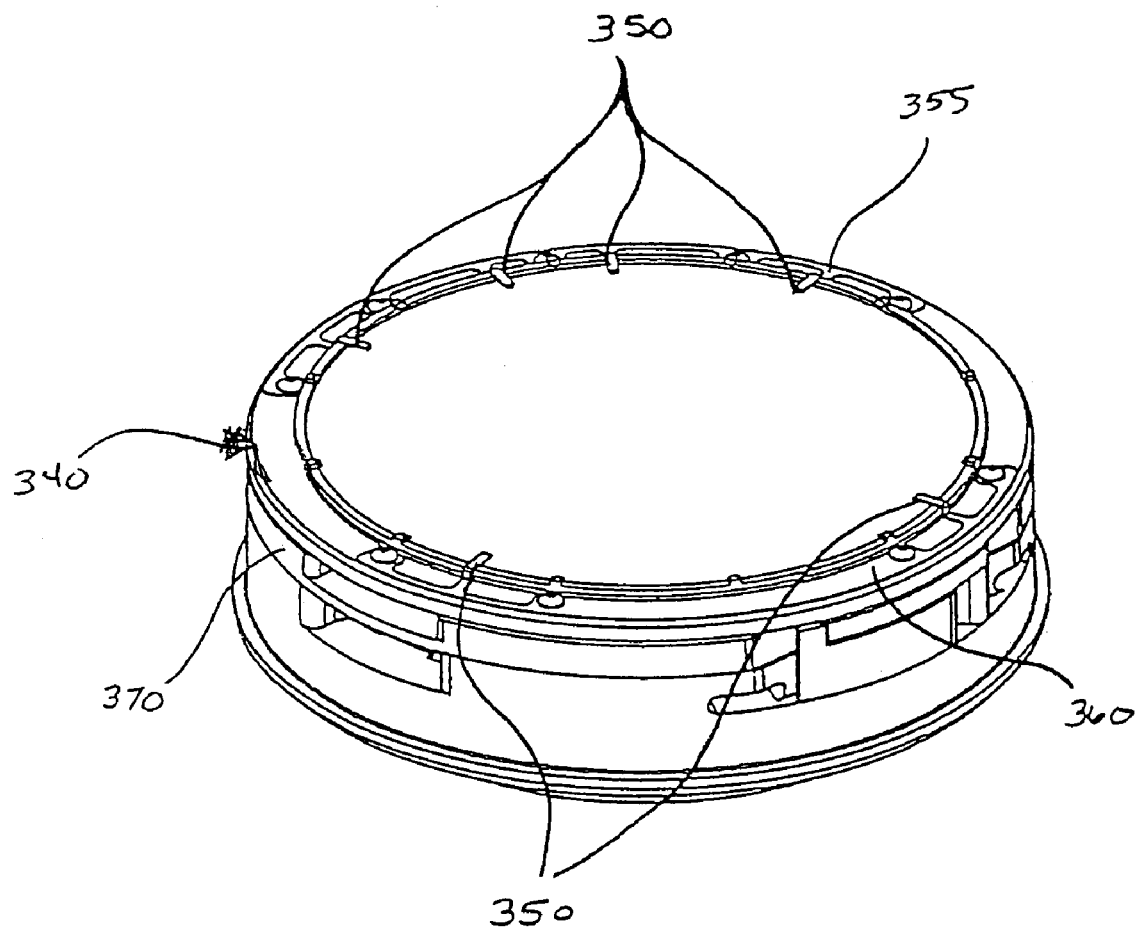
FIG. 10 illustrates a second embodiment of a contact assembly that may be used in the reactor head of the reactor shown in FIG. 2 million

FIG. 10 illustrates a further contact assembly, shown generally at 340, that may be used in the contact portion 715 of the reactor head assembly 345. As illustrated, the contact assembly 340 includes a plurality of contacts 350 that are used to supply processing power to the surface of the workpiece 25. Unlike contact assembly 910, however, the contacts 350 of contact assembly 340 are formed as two groups 355 and 360 that are electrically isolated from one another (in the absence of an electrolyte). By electrically isolating the contact groups, it becomes possible to check the resistance across the workpiece 25.

Figure 11:
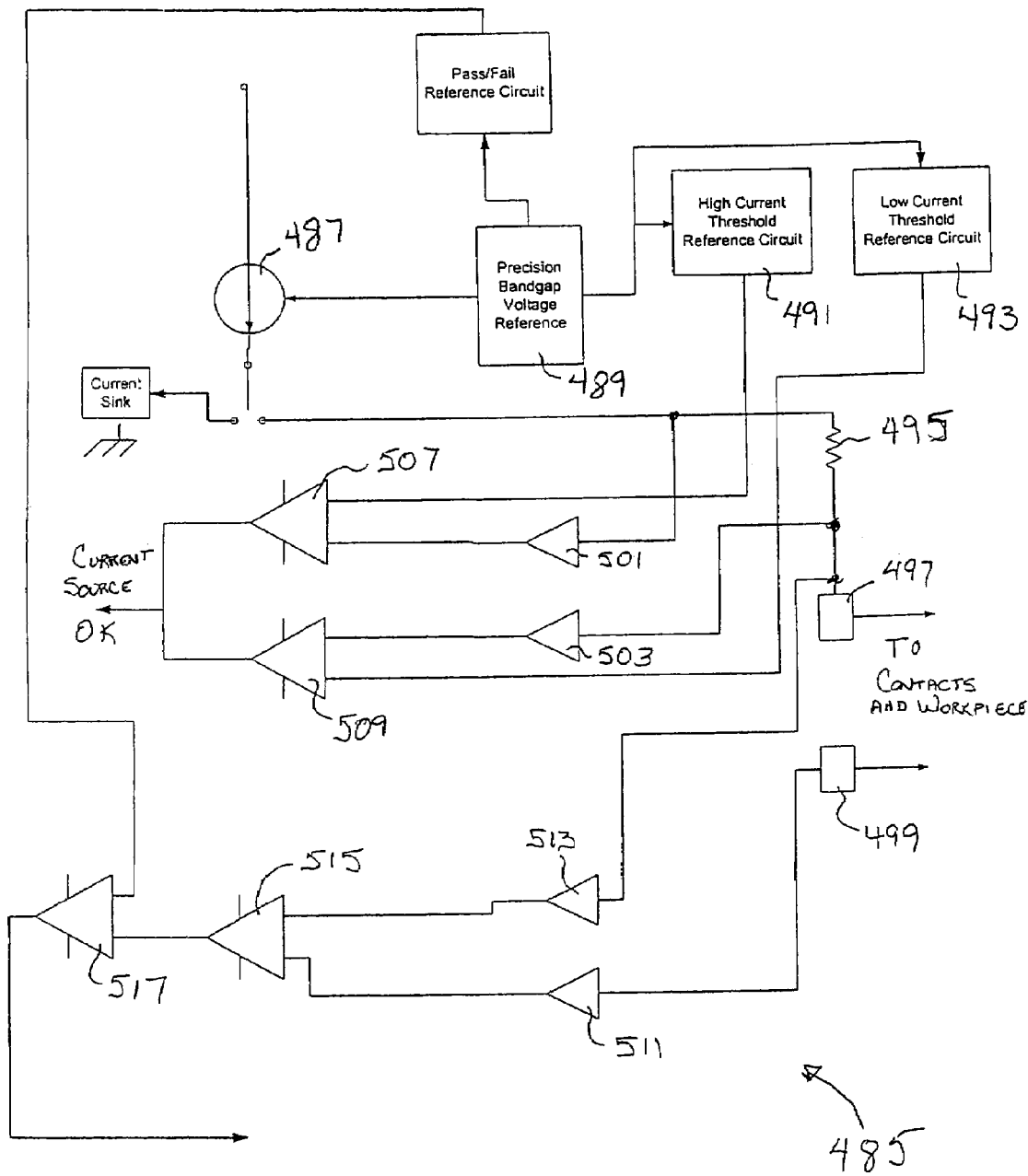
FIG. 11 is a schematic block diagram of a circuit that may be used to detect the resistance across the contacts and workpiece in a multi-segment contact assembly, such as the one shown in FIG. 10.

A schematic diagram of one embodiment of a contact resistance sensing circuit that may be used to check the resistance across the workpiece 25 is shown generally at 485 in FIG. 11. Circuit 485 is based on precise generation of a constant current by current source 487. As illustrated, precision current source 487 is referenced to a precision bandgap voltage reference 489. Bandgap voltage reference 489 also serves as a reference for the generation of upper and lower threshold voltages by circuits 491 and 493, respectively. The upper and lower threshold voltages are used to determine whether the current from the constant current source 487 is within a predetermined range before a measurement of the contact and workpiece resistance is conducted. During this pre-measurement cycle, current source 487 is switched to drive a constant current through a series-connected circuit including low resistance resistor 495 (i.e., 2 ohm), the workpiece 25 and contacts 350 and, optionally, a pair of switching circuits 497 and 499 that are used to enable current flow through the workpiece and contacts. The voltage drop across the resistor 495 is proportional to the current flowing through it. Accordingly, this voltage drop is used to determine whether the current provided by the current source 487 falls within a predetermined acceptable range. As shown, the voltage drop across resistor 495 is provided to a pair of individual amplifier circuits 501 and 503. The output signals of the amplifier circuits 501 and 503, in turn, are each provided to the input of a respective comparator circuit 507 and 509. Comparator circuit 507 compares the output voltage provided from amplifier 501 with a high current threshold reference voltage provided by reference circuit 491. Similarly, comparator circuit 509 compares the output voltage provided from amplifier 503 with a low current threshold reference voltage provided by reference circuit 493. The output signals from the competitors 507 and 509 are connected together in a wired-OR configuration. The output of this wired-OR configuration is used to determine whether the constant current flow provided by current source 487 is within a predetermined acceptable range, and is labeled as "current source okay" reflecting its function. As noted above, circuits 491 and 493 generate their respective threshold voltages with reference to the precision bandgap voltage reference 489 and, as such, these threshold values are highly stable. Each of circuits 491 and 493, as well as the voltage reference 492 that generates threshold voltage Vmax, may include adjustable precision resistors or the like to set the minimum and maximum threshold values manually. Alternatively, these values may be set using a precision digital-to-analog converter that is connected to receive voltage data values from a programmable control circuit or the like.

Provided that the current measurement falls within the predetermined range as indicated by the output of comparator circuits 507 and 509, the voltage drop across the contacts and workpiece is indicative of the resistance of the workpiece and contacts and, as such, may be measured. In the illustrated embodiment, the voltage across the contacts and workpiece is provided to a pair of amplifier circuits 511 and 513. The output signals of the amplifier circuits 511 and 513 are provided as input signals to a differential amplifier 515, which may also provide for some amplification of the signal. The output of the differential amplifier 515, in turn, is provided for comparison to an upper voltage threshold value at comparator circuit 517. Since the upper voltage threshold value is generated with respect to the precision bandgap voltage reference 489, it is highly stable and accurate. If the voltage provided at the output of differential amplifier 515 exceeds the voltage Vmax, the output of comparator 517 will be at a corresponding logic state and processing of the workpiece will not continue. However, if the voltage provided at the output of differential amplifier 515 is below the voltage Vmax, electrochemical processing of the workpiece may proceed.

Given the low resistances and high currents that must necessarily be used in the foregoing circuit, circuit stability and measurement repeatability, although strongly desired, are difficult to obtain. To overcome many of the problems associated with this stability and repeatability of circuit 485, one or more precision bandgap voltage references are used to generate the constant current as noted above. Further, current flow through the current source 487 is maintained at all times, even when no measurements are being made. This is done to insure the thermal stability of the measurement circuits, including the precision bandgap voltage reference 489. To accomplish this, a switch (either mechanical or semiconductor) may be used to switch the constant current source between a first circuit that includes the contacts and workpiece and a second circuit that directs the current into a current sink.

Figure 12:
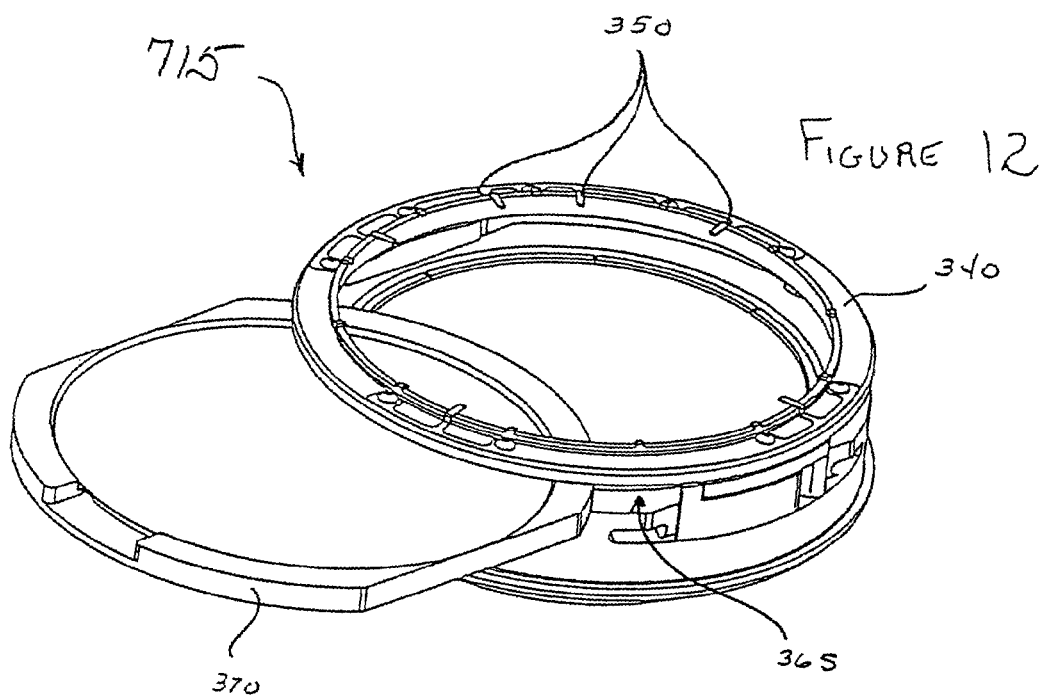
FIG. 12 illustrates an embodiment of the contact portion of the reactor head assembly shown in FIG. 2, wherein the contact portion is adapted to accept a tray that holds the workpiece.

The embodiment of the contact portion 715 illustrated in FIG. 12 is adapted to load and unload the workpiece 25 using a workpiece tray. To this end, the contact portion 715 includes a tray slot 365 through which a tray 370 may be inserted and extracted. Tray 370, is shown, is adapted for receiving a workpiece 25, and provides a degree of protection for the workpiece as it is loaded onto the contact portion 711 of the head assembly 345 through the tray slot 365. Once inserted into the tray slot 365, the workpiece 25 can make a connection with the contacts 350 of the contact assembly 340 for processing.

Figure 13A:
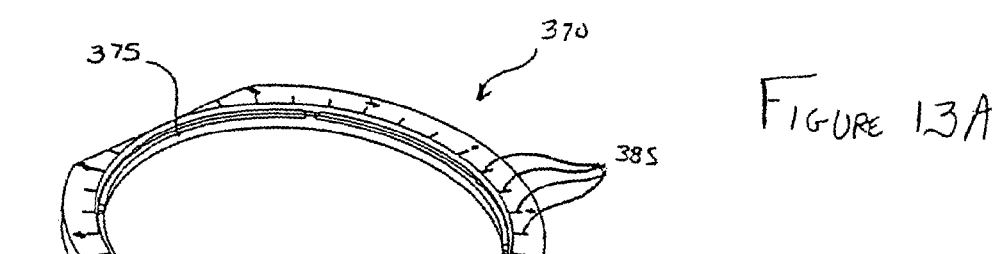
FIGS. 13A and 13B illustrate one embodiment of a tray that may be used with the contact portion shown in FIG. 2.
Figure 13B:
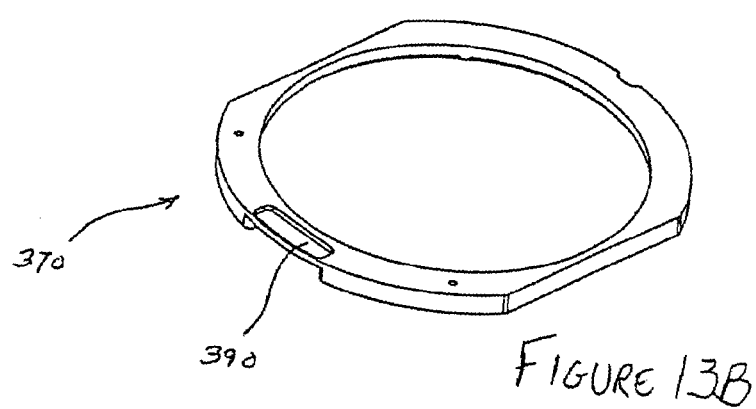

FIGS. 13A and 13B illustrate both top and bottom isometric views of a tray 370 adapted for receiving such a workpiece 25. As shown in FIG. 13A, the top of the tray 370 includes a circular depression 375 corresponding to the shape of the workpiece 25 to be received. At one end of the tray is a slot 380 through which a vacuum wand (not shown) may be inserted or removed, to facilitate placement and removal of a workpiece 25 onto the tray 370. The top of the tray further includes a series of markings 385 located around the periphery of the workpiece depression 375 that enable the operator to visually verify the proper angular positioning of the workpiece as it is loaded onto the tray 370.

The tray 370 may be manually loaded and removed from the head assembly 345. As shown in FIG. 13B, the bottom of the tray 370 includes a depression 390 for facilitating gripping the tray 370 with a handle assembly 400 (FIGS. 14A, B and C) proximate the slot 380 through which an air wand, or similar instrument, can be inserted.

As can be seen in FIGS. 14A-14C, the handle assembly 400 includes both a first piece 405 and second piece 410. The first piece 405 and the second piece 410 are coupled together by a pair of screws 415 and slide pins 420. The slide pins 420 reside within a pair of slots 425 located within the first piece 405. This construction allows the first piece 405 to slide with respect to the second piece 410. The handle assembly 400 further includes a plunger pin 430. The plunger pin 430 is adapted for moving within a slot 435 formed within the second piece 410. The plunger pin 430 is further adapted for engaging a detent 440 at one end of the slot 435. Once engaged plunger pin 430 and detent 440 provide a slight retaining force.

When the top piece 405 is shifted forward with respect to the second piece 410, a protrusion 445 at the front of the handle located at the second of the top piece is exposed. The protrusion 445 is sized and shaped to correspond to depression 390 included in the bottom of tray 370. By sliding the first piece 405 even with the second piece 410, the front 450 of the second piece 410 extends over the protrusion 445. If the protrusion 445 of the top piece 405 of handle assembly 400 has been received into the depression 390 of tray 370, the engagement serves to fix the handle assembly 400 to the tray 370. The tray 370 may then be carried by the handle assembly 400 and readily inserted into the tray slot 365. By subsequently sliding the first piece 405 forward with respect to the bottom piece 410, the handle assembly 400 may be disengaged from the tray 370. The first piece 405 and second piece 410 each include a corresponding indentation 455, 460, which can be gripped by the operator to facilitate movement of the first piece 405 with respect to the second piece 410.

Numerous modifications may be made to the foregoing system without departing from the basic teachings thereof. Although the present invention has been described in substantial detail with reference to one or more specific embodiments, those of skill in the wart will recognize that changes may be made thereto without departing from the scope and spirit of the invention as set forth in the appended claims.

What is claimed is:

1. A reactor for electrochemically processing a microelectronic workpiece, the reactor comprising:

a reactor head assembly including a workpiece contact for providing electrochemical processing power to a surface of a workpiece held by the reactor head assembly, the reactor head assembly being movable between a workpiece loading/unloading position and a workpiece processing position;

a reactor base assembly including a movable electrode assembly having an electrode surface that is movable along a plane that is generally parallel to the surface of a workpiece held by the reactor head assembly when the reactor head assembly is in the workpiece processing position; and a gap adjustment assembly disposed on the reactor base assembly to mechanically adjust the spacing that is present between the electrode surface and the surface of the microelectronic workpiece, including a central region of the workpiece surface, during processing thereof.

2. The reactor of claim 1 wherein the gap adjustment assembly comprises a plurality of individually adjustable gap adjustment mechanisms.

3. The reactor of claim 2 wherein the plurality of individually adjustable gap adjustment mechanisms are disposed at generally equal intervals about a peripheral portion of the microelectronic workpiece.

4. The reactor of claim 3 wherein the reactor base assembly comprises:
- a head engagement assembly including the movable electrode assembly;
- a base chamber;
- the head engagement assembly being compliantly mounted to the base chamber.

5. The reactor of claim 2 wherein each of the plurality of individually adjustable mechanisms comprises a micrometer that is adjustable to set the gap between the surface of the workpiece under process and the surface of the electrode of the movable electrode assembly.

6. The reactor of claim 2 wherein the reactor base assembly comprises:
- a head engagement assembly including the movable electrode assembly;
- a base chamber;
- the head engagement assembly being compliantly mounted to the base chamber.

7. The reactor of claim 1 wherein the gap adjustment assembly comprises a micrometer that is used to adjust the gap between the surface of the electrode of the movable electrode assembly and the surface of the microelectronic workpiece.

8. The reactor of claim 1 wherein the reactor base assembly comprises:
- a head engagement assembly including the movable electrode assembly;
- a base chamber;
- the head engagement assembly being compliantly mounted to the base chamber.

9. A reactor for electrochemically processing a microelectronic workpiece, the reactor comprising:
- a reactor head assembly including a workpiece contact for providing electrochemical processing power to a surface of a workpiece held by the reactor head assembly, the reactor head assembly being movable into a workpiece processing position;
- a reactor base assembly including an electrode assembly having an electrode surface that is movable along a plane that is generally parallel to the surface of the workpiece held by the reactor head assembly when the reactor head assembly is in the workpiece processing position; and
- a plurality of individually adjustable gap adjustment mechanisms disposed on the reactor, with at least one of the gap adjustment mechanisms including a micrometer for mechanically adjusting the spacing between the electrode surface and the entire surface of the workpiece when the workpiece is in the processing position.

10. The reactor of claim 9 wherein the plurality of individually adjustable gap adjustment mechanisms are disposed at generally equal intervals about a periphery of the workpiece when the workpiece is in the processing position.

11. The reactor of claim 10 wherein exactly three gap adjustment mechanisms are disposed at generally equal intervals about a periphery of the workpiece when the workpiece is in the processing position.

12. A reactor for electrochemically processing a microelectronic workpiece, the reactor comprising:
- a reactor head assembly including a workpiece contact for providing electrochemical processing power to a surface of a workpiece held by the reactor head assembly, the reactor head assembly being movable into a workpiece processing position;
- a reactor base assembly including an electrode assembly having an electrode surface that is generally parallel to the surface of the workpiece held by the reactor head assembly when the reactor head assembly is in the workpiece processing position; and
- a plurality of individually adjustable gap adjustment mechanisms disposed on the reactor, with at least one of the gap adjustment mechanisms including:
- a base portion;
- an axle pivotable about the base portion;
- an arm attached to a first end of the axle;
- a lever attached to a second end of the axle, such that pivoting the lever in a first direction raises the arm, and pivoting the lever in a second direction lowers the arm; and
- a micrometer that is adjustable to pivot the lever about the base to raise and lower the arm, which adjusts the spacing between the electrode surface and the surface of the workpiece when the workpiece is in the workpiece processing position.

13. The reactor of claim 12 further comprising a spherical head attached to the arm, with the spherical head configured to engage a contact portion of the reactor head assembly when the reactor head assembly is in the workpiece processing position.

14. The reactor of claim 12 wherein the plurality of individually adjustable gap adjustment mechanisms are disposed at generally equal intervals about a periphery of the workpiece when the workpiece is in the processing position.

15. The reactor of claim 12 wherein exactly three gap adjustment mechanisms are disposed at generally equal intervals about a periphery of the workpiece when the workpiece is in the processing position.

* * * * *